United States Patent
Toubou

(10) Patent No.: US 8,178,905 B2
(45) Date of Patent: May 15, 2012

(54) LAYOUT STRUCTURE OF SEMICONDUCTOR DEVICE

(75) Inventor: Tetsurou Toubou, Hyogo (JP)

(73) Assignee: Panasonic Corporation, Osaka (JP)

( * ) Notice: Subject to any disclaimer, the term of this patent is extended or adjusted under 35 U.S.C. 154(b) by 747 days.

(21) Appl. No.: 11/972,890

(22) Filed: Jan. 11, 2008

(65) Prior Publication Data
US 2008/0169868 A1    Jul. 17, 2008

(30) Foreign Application Priority Data
Jan. 12, 2007    (JP) .................... 2007-004662

(51) Int. Cl.
*H01L 23/52*    (2006.01)
*H01L 23/50*    (2006.01)
*H01L 23/535*    (2006.01)
*H01L 21/82*    (2006.01)

(52) U.S. Cl. ......... 257/207; 257/E23.079; 257/E23.168; 438/129

(58) Field of Classification Search .................. None
See application file for complete search history.

(56) References Cited

U.S. PATENT DOCUMENTS

| | | | |
|---|---|---|---|
| 6,396,087 B1 * | 5/2002 | Kitabayashi et al. ......... | 257/207 |
| 6,674,112 B1 | 1/2004 | Tadaki et al. | |
| 7,115,460 B2 | 10/2006 | Shaw et al. | |
| 2005/0001271 A1 * | 1/2005 | Kobayashi ................... | 257/368 |
| 2005/0051801 A1 * | 3/2005 | Shaw et al. ................... | 257/202 |
| 2006/0134853 A1 | 6/2006 | Shaw et al. | |
| 2007/0033548 A1 * | 2/2007 | Tatsumi ............................ | 716/1 |
| 2007/0096154 A1 * | 5/2007 | Shimbo et al. ................ | 257/207 |

FOREIGN PATENT DOCUMENTS

| | | |
|---|---|---|
| JP | 2001-148464 | 5/2001 |
| JP | 2001-237328 | 8/2001 |
| JP | 2003-309178 | 10/2003 |
| JP | 3672788 | 7/2005 |

* cited by examiner

*Primary Examiner* — Hoang-Quan Ho
(74) *Attorney, Agent, or Firm* — McDermott Will & Emery LLP

(57) ABSTRACT

In a layout structure capable of independent supply of a substrate or well potential from a power supply potential, further reduction in layout area is achieved. A reinforcing power supply cell is inserted in a cell line in which a plurality of cells are arranged in series. Each of the cells includes an impurity doped region for supplying a substrate or well potential NWVDD which is different from a positive power supply potential VDD to a p-type transistor arranging region. The reinforcing power supply cell includes a power supply impurity doped region to which an impurity doped region of an adjacent cell is electrically connected and a power supply wire provided in a wiring layer formed above the power supply impurity doped region and electrically connected to the power supply impurity doped region.

8 Claims, 20 Drawing Sheets

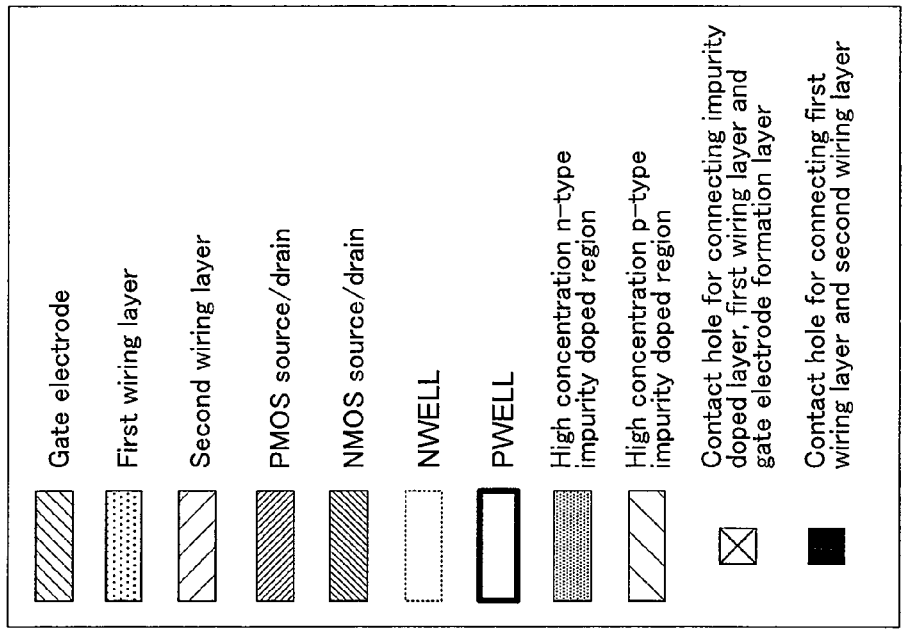

E-E' cross section

G-G' cross section

D-D' cross section

F-F' cross section

H-H' cross section

I-I' cross section

J-J' cross section

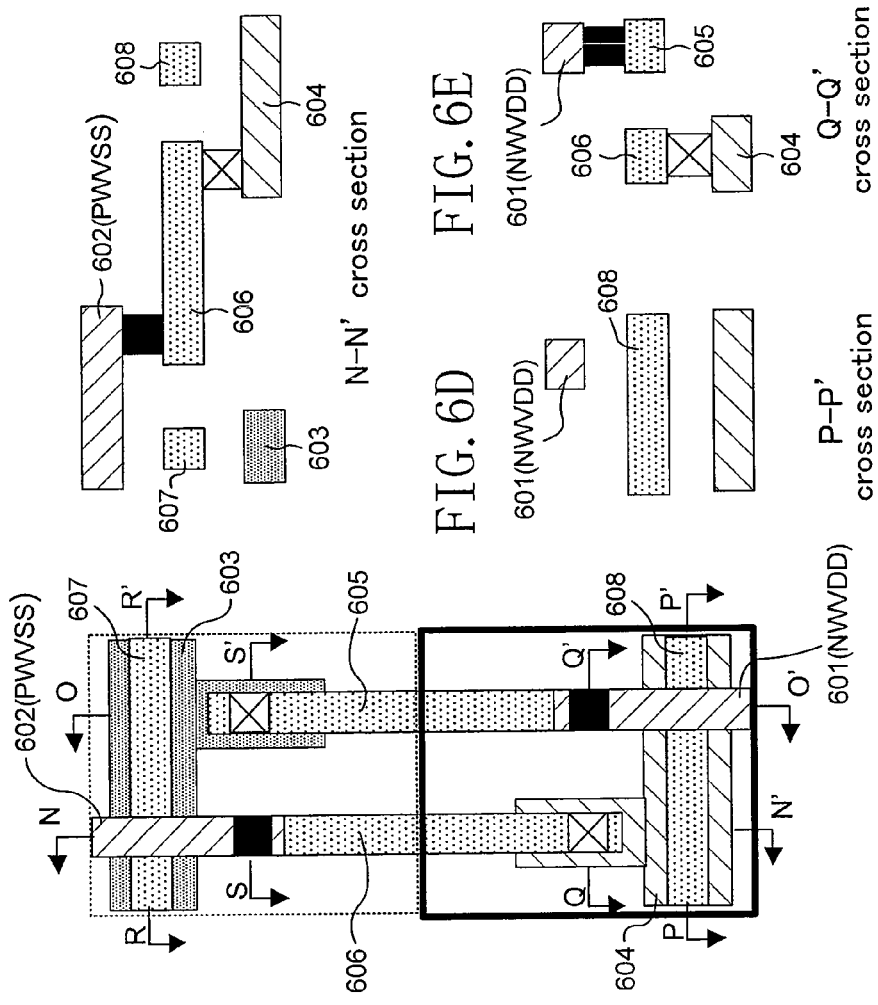

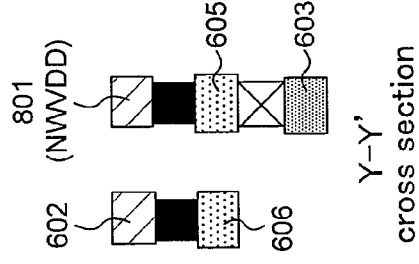
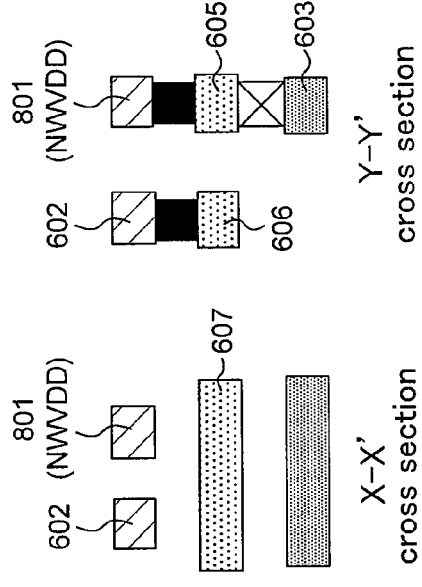
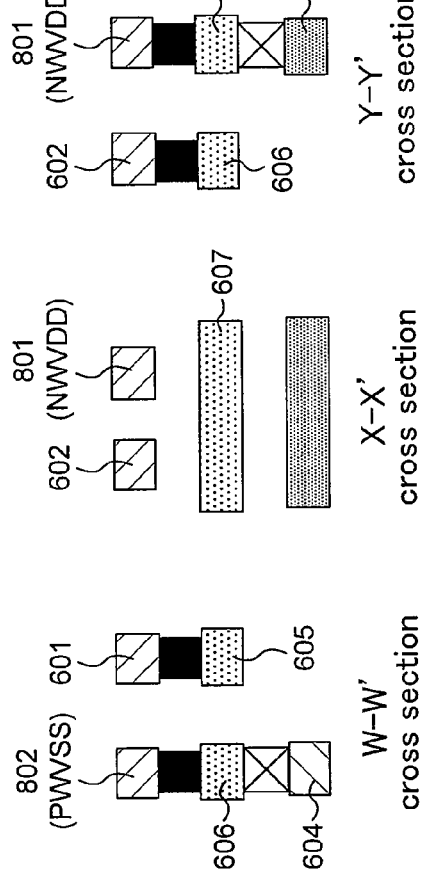
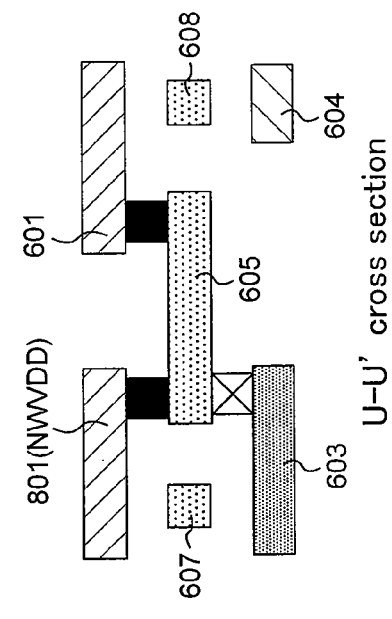
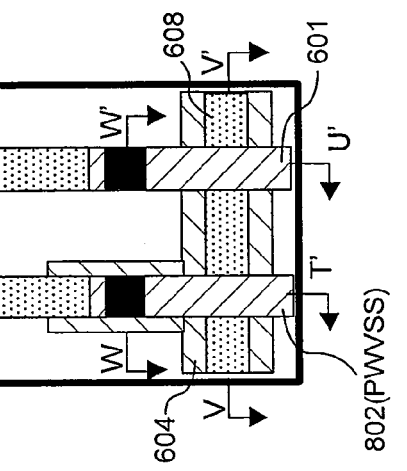
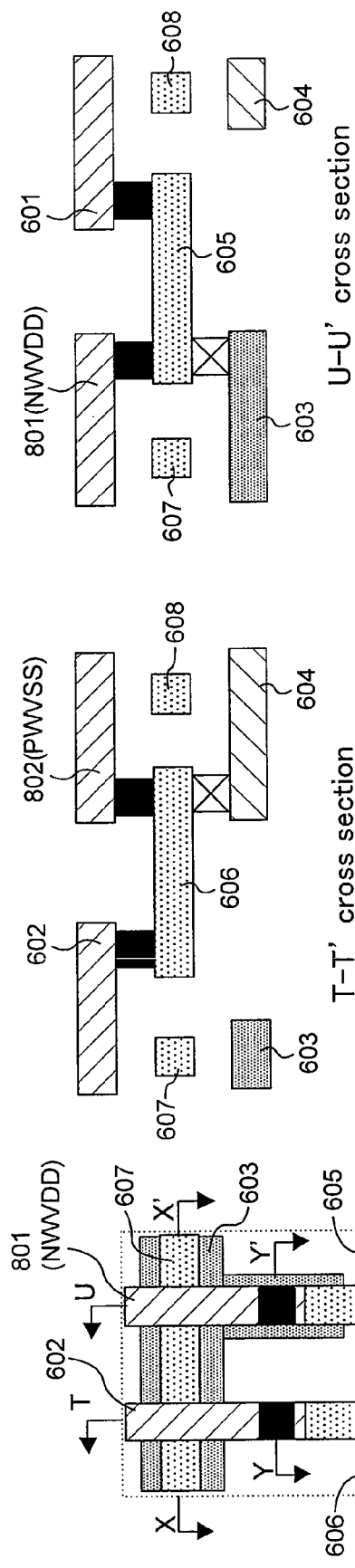

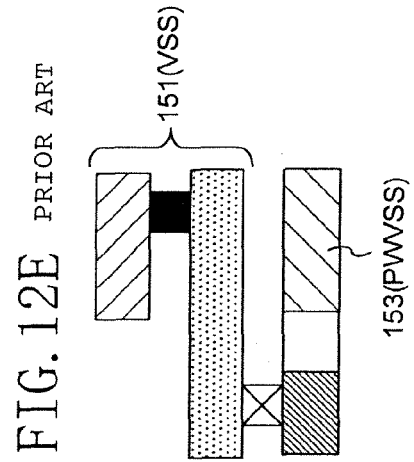
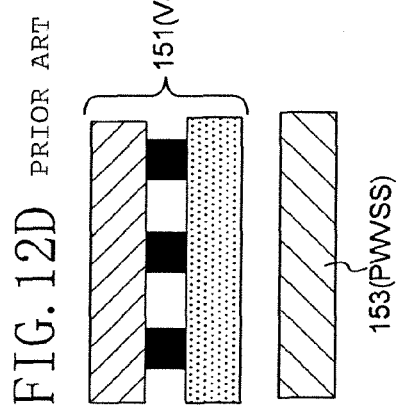
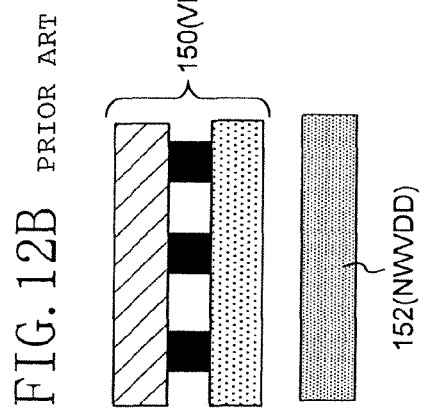
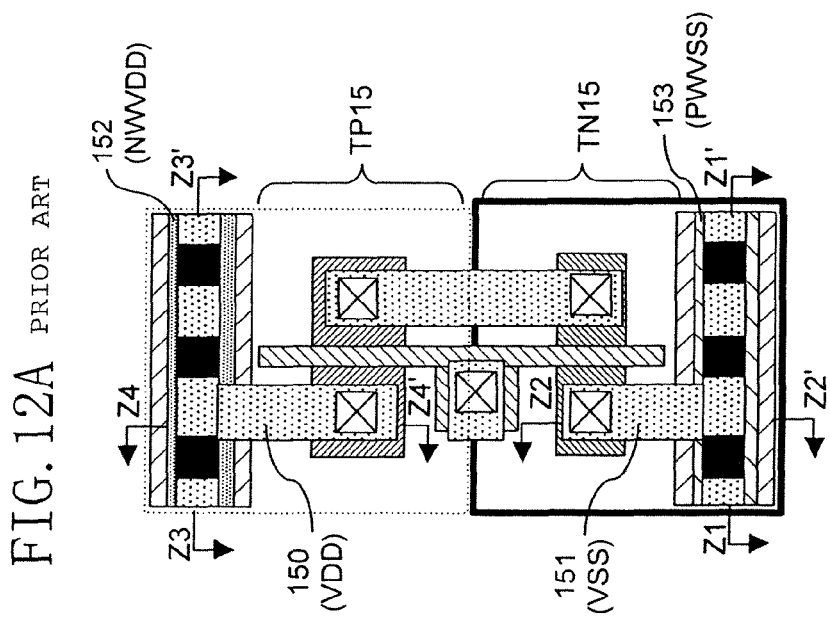
FIG. 12A PRIOR ART
FIG. 12B PRIOR ART
FIG. 12C PRIOR ART
FIG. 12D PRIOR ART
FIG. 12E PRIOR ART

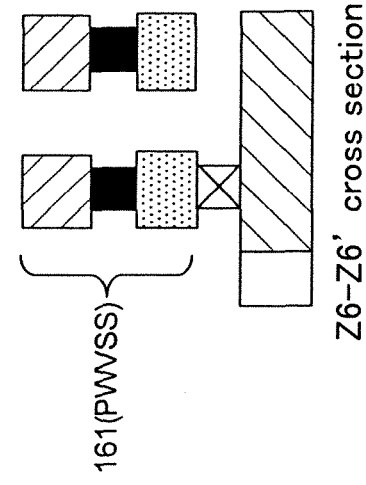
FIG. 13C PRIOR ART
Z8-Z8' cross section
160(NWVDD)
162(VDD)
FIG. 13B PRIOR ART
Z7-Z7' cross section
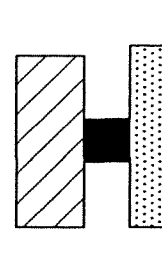
FIG. 13E PRIOR ART
Z6-Z6' cross section
161(PWVSS)
FIG. 13D PRIOR ART
Z5-Z5' cross section
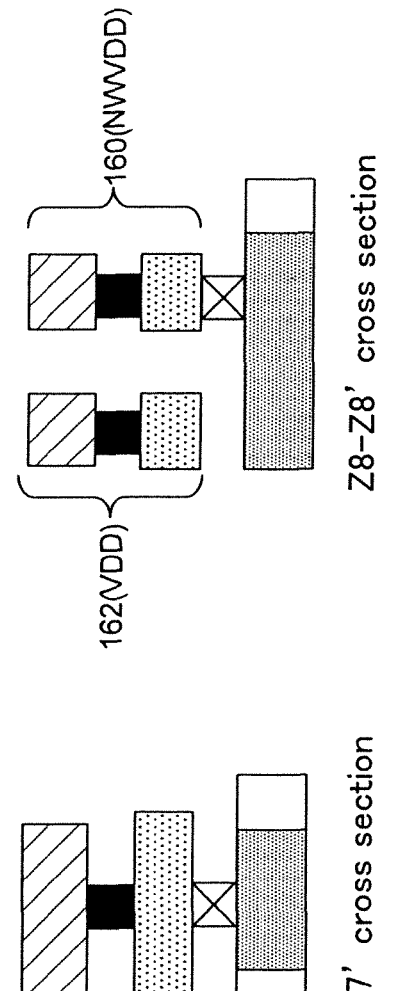
FIG. 13A PRIOR ART
162(VDD)
160(NWVDD)
161(PWVSS)

FIG. 18
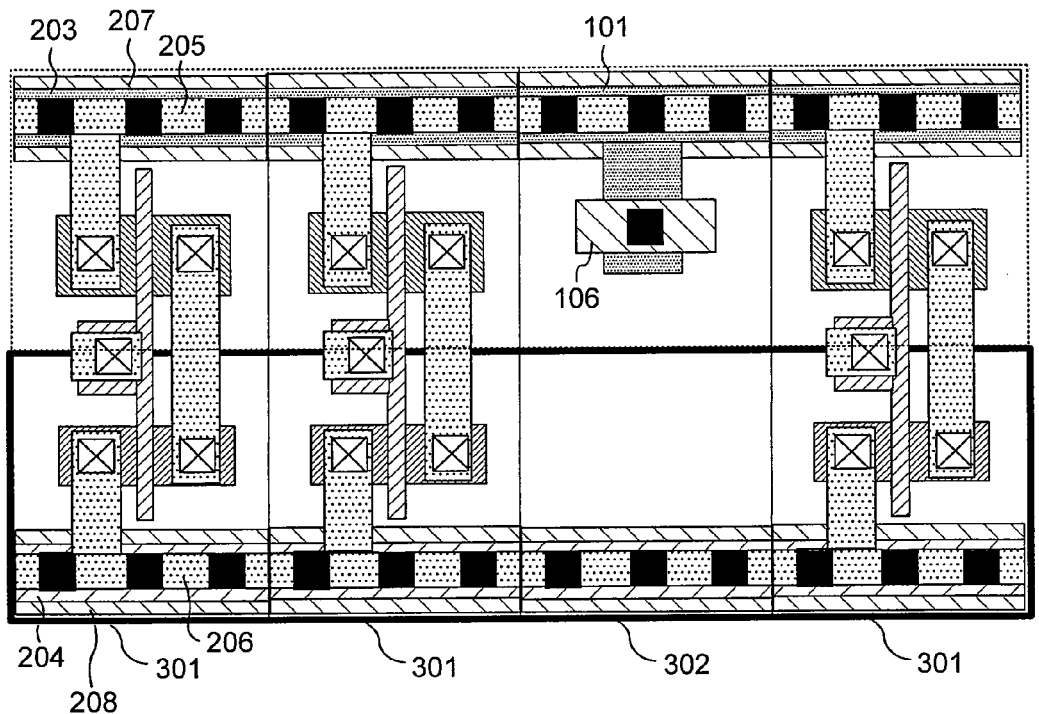
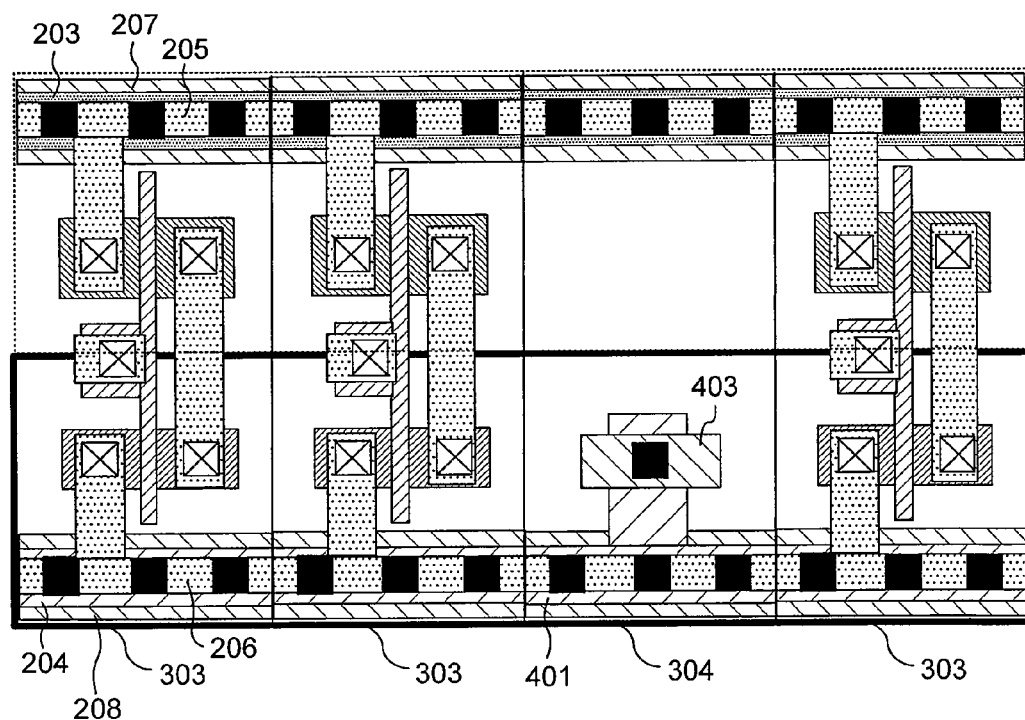

LAYOUT STRUCTURE OF SEMICONDUCTOR DEVICE

CROSS-REFERENCE TO RELATED APPLICATION

The disclosure of Japanese Patent Application No. 2007-4662 filed on Jan. 12, 2007, including specification, drawings and claims is incorporated herein by reference in its entirety.

BACKGROUND OF THE INVENTION

1. Field of the Invention

The present invention relates to a layout structure for a semiconductor device, and more particularly relates to a layout structure capable of independent supply of a substrate or well potential from a power supply potential.

2. Description of the Related Art

In recent years, reduction in stand-by current in an LSI using MOS (metal oxide semiconductor) transistors has been an important issue. However, due to reduction in process size and reduction in threshold voltage resulting from the development of low voltage LSIs, leakage currents in transistors in OFF state have been increased to a nonnegligible level.

To cope with such problems, there has been a known method in which a leakage current in a transistor is reduced by setting a substrate or well potential at a different level from a source potential so that a threshold voltage is set to be apparently high. In this method, a substrate potential is set to be lower than a source potential in an n-type transistor and a substrate potential is set to be higher than a source potential in a p-type transistor. Moreover, to use this method, in an LSI design using automatic placing and routing, it is necessary to make it possible to set a substrate or well potential at a different level from a source potential in cell data contained in a standard cell library.

FIGS. 12A through 12E are views illustrating an exemplary known cell layout structure which is configured so that a substrate or well potential can be supplied independently from a power supply potential. FIG. 12A is a plan view of the known cell layout structure. FIGS. 12B through 12E are cross-sectional views of the layout structure of FIG. 12A.

In the structure shown in FIGS. 12A through 12E, a VDD wire 150 and a VSS wire 151 are provided in a first wiring layer for wiring in cells and a second wiring layer formed above the first wiring layer. A substrate or well potential of a PMOS TP15 is supplied from a high concentration n-type impurity doped region 152 located above a PMOS substrate or an n-well but is not supplied from the VDD wire 150. A substrate or well potential of a NMOS TN15 is supplied from a high concentration p-type impurity doped region 153 located above an NMOS substrate or a p-well but is not supplied from the VSS wire 151. In the layout structure of FIGS. 12A through 12E, the substrate or well potential is supplied only by the impurity doped region. Compared to a wiring layer, an impurity doped region has a higher sheet resistance by one or more orders of magnitude and therefore a potential drop easily occurs. Accordingly, a substrate or well potential is not stable and a threshold in a transistor fluctuates, or like inconvenience occurs. This causes problems such as reduction in reliability of an LSI operation, insufficient suppression of a stand-by leakage current and the like.

To avoid the above-described problems, a method using a reinforcing power supply cell shown in FIGS. 13A through 13E has been proposed (disclosed in Patent References 1 and 2). FIG. 13A is a plan view of the layout structure and FIGS. 13B through 13E are cross-sectional views of the layout structure of FIG. 13A. In this proposal, the reinforcing power supply cell of FIGS. 13A through 13E and a cell having the layout structure of FIGS. 12A through 12E are combined and arranged, for example, in the manner shown in FIG. 14. Thus, reinforcing power supply for a substrate or well potential can be performed through a wire 160 and a wire 161 of FIGS. 13A through 13E provided in a first wiring layer and a second wiring layer. Therefore, a stable potential can be supplied as a substrate or well potential independently from a power supply potential.

(Patent Reference 1) Japanese Patent No. 3672788
(Patent Reference 2) Japanese Laid-Open Publication No. 2003-309178
(Patent Reference 3) Japanese Laid-Open Publication No. 2001-148464

However, the known layout structure has the following problems.

In the layout structure of FIGS. 12A through 12E, FIGS. 13A through 13E and FIGS. 14A through 14E, power is supplied simultaneously to a substrate or well at a high potential (NWVDD) side and a substrate or well at a low potential (PWVDD) side through the reinforcing power supply cell. However, it has become clear that as the process size has been reduced, a maximum effect of reduction of a leakage current by controlling a substrate or well potential can not be necessarily achieved when both of the NWVDD side and the PWVSS side are simultaneously controlled, and there are cases where a greater effect can be achieved by controlling only one of the NWVDD side and the PWVSS side.

More detail explanation on this will be given below. As shown in a schematic view of an NMOS of FIGS. 15A and 15B, leakage currents are divided roughly into three groups: (1) sub-threshold leakage current flowing from a drain to a source when a transistor is in a non-conductive state; (2) junction leakage current flowing from a drain to a substrate by interband tunneling when a transistor is in a non-conductive state; and (3) gate leakage current tunneling though a gate insulating film and flowing from a gate electrode to a source and a drain via an inversion layer when a transistor is in a conductive state. A leakage current in an LSI is a total sum of the three currents. To control a sub-threshold leakage current of those three, a so-called "substrate control technique" has been introduced. The substrate control technique is a technique in which a bias voltage is applied to a substrate terminal of a transistor to control a threshold voltage. Specifically, application of a bias voltage in the direction in which carries flow less easily is referred to as "reverse body bias (RBB)". To reduce a sub-threshold leakage current, application of a bias by RBB is effective. It is considered that the larger a bias amount is, the greater the effect of reduction of a sub-threshold leakage current is.

As a type of junction leakage current, there is a current called GIDL (gate induced drain leakage) flowing when a high electric field is applied to a region located in the vicinity of a drain and close to a gate. A GIDL current is characterized in that it is increased by increasing bias application by RBB. Due to recent reduction in process size, control of electric field in the region located in the vicinity of a drain and close to a gate is more difficult, and therefore, the ratio of a GIDL current to a leakage current is now nonnegligible.

Thus, a sub-threshold leakage current and a GIDL current (junction leakage current) is in the relationship in which by increasing bias application by RBB, the sub-threshold leakage current is reduced but the GIDL current is increased. Therefore, to minimize a leakage current, the known method in which RBB is merely set to be large is not proper and it is necessary to assess an optimum level and then set RBB. For example, depending on transistor characteristics, there might be cases where the GIDL current (junction leakage current) after the increase is larger than the sub-thread leakage current which can be reduced by performing substrate control. In such a case, a leakage current can not be reduced. For the above-described reason, it is understood that there are cases where a greater effect of reduction in leakage current can be achieved by controlling only one of the NWVDD side and the PWVSS side.

In such a case, the reinforcing power supply cell arranged originally for the purpose of supplying, as a substrate or well potential, a different potential from a power supply potential can be used to supply, as a substrate or well potential, the same potential as the power supply potential, thereby achieving a desired leakage current reduction effect. For example, in FIGS. 13A through 13E, a VDD wire 162 and the wire (which will be hereafter referred to as a "NWVDD wire") 160 for reinforcing power supply for the substrate or well potential on the NWVDD side are connected to one another in the second wiring layer. Thus, a potential power supply potential and the substrate or well potential at the NWVDD side can be made to be the same potential. However, in this method, a wiring region of the second wiring layer in the reinforcing power supply cell is wastefully used and thus increase in chip area is caused.

To further reduce a layout area of a semiconductor device, a reinforcing power supply cell having a layout structure which achieve the same effects as those of the reinforcing power supply cell of FIGS. 13A through 13E and exhibits high wiring efficiency has to be obtained.

Moreover, to further reduce a layout area of a semiconductor device, it is preferable that the object of supplying, as a substrate or well potential, a stable potential independently from a power supply potential is achieved and, at the same time, the number of reinforcing power supply cells to be arranged is reduced as small as possible.

SUMMARY OF THE INVENTION

The present invention has been devised to make it possible to reduce a layout area in a layout structure in which a substrate or well potential can be supplied independently from a power supply potential.

A first aspect of the present invention is directed to a layout structure of a semiconductor device and the layout structure includes: a cell line including a plurality of cells arranged in series; and a reinforcing power supply cell arranged in any one of positions between the cells in the cell line. In the layout structure, each said cell is formed so that a substrate or well potential which is different from a positive power supply potential can be supplied in a p-type transistor arranging region and a substrate or well potential which is the same as a ground potential is supplied in an n-type transistor arranging region, each said cell has an impurity doped region for supplying the substrate or well potential which is different from the positive power supply potential to the p-type transistor arranging region and the impurity doped regions of the cells adjacent to each other are electrically connected, and the reinforcing power supply cell includes: a power supply impurity doped region to which the impurity doped region in one of the cells located adjacent thereto is electrically connected; and a power supply wire provided in a wiring layer formed above the power supply impurity doped region and electrically connected to the power supply impurity doped region.

According to the first aspect, by the reinforcing power supply cell, a stable potential can be independently supplied as a substrate or well potential from a positive power supply potential only in the p-type transistor arranging region of each cell. Therefore, if the layout structure is adopted when it is desired to independently control a potential only in the NWVDD side, a wiring region of the wiring layer used in the reinforcing power supply cell can be reduced, thus resulting in reduction in layout area.

A second aspect of the present invention is directed to a layout structure of a semiconductor device and the layout structure includes: a cell line including a plurality of cells arranged in series; and a reinforcing power supply cell arranged in any one of positions between the cells in the cell line. In the layout structure, each said cell is formed so that a substrate or well potential which is the same as a positive power supply potential is supplied in a p-type transistor arranging region and a substrate or well potential which is different from a ground potential can be supplied in an n-type transistor arranging region, each said cell has an impurity doped region for supplying the substrate or well potential which is different from the ground potential to the n-type transistor arranging region and the impurity doped regions of the cells adjacent to each other are electrically connected, and the reinforcing power supply cell includes: a power supply impurity doped region to which the impurity doped region in one of the cells located adjacent thereto is electrically connected; and a power supply wire provided in a wiring layer formed above the power supply impurity doped region and electrically connected to the power supply impurity doped region.

According to the second aspect of the present invention, with the reinforcing power supply cell, a stable potential can be independently supplied as a substrate or well potential from a positive power supply potential only in the n-type transistor arranging region of each cell. Therefore, if the layout structure is adopted when it is desired to independently control a potential only in the PWVSS side, a wiring region of the wiring layer used in the reinforcing power supply cell can be reduced, thus resulting in reduction in layout area.

A third aspect of the present invention is directed to a layout structure of a semiconductor device and the layout structure includes: a cell line including a plurality of cells arranged in series; and a reinforcing power supply cell arranged in any one of positions between the cells in the cell line. In the layout structure, each said cell includes: a first impurity doped region for supplying a substrate or well potential which is different from a positive power supply potential to a p-type transistor arranging region; and a second impurity doped region for supplying a substrate or well potential which is different from a ground potential to an n-type transistor arranging region, the first and second impurity doped regions of the cells adjacent to each other are electrically connected, respectively, each said reinforcing power supply cell includes: first and second power supply impurity doped regions to which the first and second impurity doped regions in one of the cells located adjacent thereto are electrically connected, respectively; first and second power supply wires provided in a first wiring layer formed above the first and second power supply doped regions and electrically connected to the first and second power supply impurity doped regions, respectively; and first and second pins provided in a second wiring layer formed above the first and second power supply wires and electrically connected to the first and second power supply wires, respectively, and the first and second pins are arranged in the same straight line extending in parallel to a direction of alignment of the cells.

According to the third aspect, in the reinforcing power supply cell, the first pin provided for the reinforcing power supply at the NWVDD side and the second pin provided for reinforcing power supply at the PWVSS side are arranged on the same straight line in parallel to the direction of alignment of the cells. Thus, a region of the second wiring layer used in the reinforcing power supply cell can be reduced. Therefore, a resulting blank region can be utilized for connection of a pin of another cell or the like, thus resulting in reduction in layout area.

A fourth aspect of the present invention is directed to a layout structure of a semiconductor device and the layout structure includes: a cell line including a plurality of cells arranged in series; and a reinforcing power supply cell arranged in any one of positions between the cells in the cell line. In the layout structure, each said cell includes: a first impurity doped region for supplying a substrate or well potential which is different from a positive power supply potential to a p-type transistor arranging region; and a second impurity doped region for supplying a substrate or well potential which is different from a ground potential to an n-type transistor arranging region, the first and second impurity doped regions of the cells adjacent to each other are electrically connected, respectively, each said reinforcing power supply cell includes: first and second power supply impurity doped regions to which the first and second impurity doped regions in one of the cells located adjacent thereto are electrically connected, respectively; first and second power supply wires provided in a first wiring layer formed above the first and second power supply doped regions and electrically connected to the first and second power supply impurity doped regions, respectively; and first and second pins provided in a second wiring layer formed above the first and second power supply wires and electrically connected to the first and second power supply wires, respectively, and the first and second pins are arranged in the same straight line extending perpendicularly to a direction of alignment of the cells.

According to the fourth aspect of the present invention, in the reinforcing power supply cell, the first pin provided for reinforcing power supply at the NWVDD side and the second pin provided for reinforcing power supply at the PWVSS side are arranged on the same straight line perpendicular to the direction of alignment of the cells. Thus, a region of the second wiring layer used in the reinforcing power supply cell can be reduced. Therefore, a resulting blank region can be utilized for connection of a pin of another cell or the like, thus resulting in reduction in layout area.

A fifth aspect of the present invention is directed to a layout structure of a semiconductor device and the layout structure includes: a cell line including a plurality of cells arranged in series; and a reinforcing power supply cell arranged in any one of positions between the cells in the cell line. In the layout, each said cell has an impurity doped region for supplying a substrate or well potential which is different from a power supply potential and the impurity doped regions of the cells adjacent to each other are electrically connected, the reinforcing power supply cell includes: a power supply impurity doped region to which the impurity doped region in one of the cells located adjacent thereto is electrically connected; a first power supply wire provided in a first wiring layer formed above the power supply impurity doped region and electrically connected to the power supply impurity doped region; and a second power supply wire provided in a second wiring layer formed above the first power supply wire and electrically connected to the first power supply wire, and the second power supply wire extends to reach one end of the reinforcing power supply cell in a perpendicular direction to a direction of alignment of the cells.

According to the fifth aspect of the present invention, in the reinforcing power supply cell, the second power supply wire provided for reinforcing power supply of a substrate or well potential extends to reach one end of the reinforcing power supply cell in the perpendicular direction to the direction of alignment of the cells. Thus, only by arranging reinforcing power supply cells in the up-to-down direction, connection between second power supply wires is completed. Accordingly, there is no need to provide another wire for connection between the second power supply wires and high area efficiency can be achieved, thus resulting in reduction in layout area.

A sixth aspect of the present invention is directed to a layout structure of a semiconductor device and the layout structure includes: a plurality of cell lines each including a plurality of cells arranged in series; and a reinforcing power supply cell arranged in any one of positions between the cells in the cell lines. In the layout structure, each said cell has an impurity doped region for supplying a substrate or well potential which is different from a power supply potential and the impurity doped regions of the cells adjacent to each other are electrically connected, the reinforcing power supply cell includes: a power supply impurity doped region to which the impurity doped region in one of the cells located adjacent thereto is electrically connected; and a power supply wire provided in a wiring layer formed above the power supply impurity doped region and electrically connected to the power supply impurity doped region, the plurality of cell lines are provided so that arrangement of a p-type transistor arranging region and an n-type transistor arranging region is inversed in every second cell line and a power supply wire and a substrate or well potential wire are shared by the cell lines adjacent to each other, and the reinforcing power supply cell is arranged in every second cell line of the plurality of the cell lines.

According to the sixth aspect of the present invention, in the structure in which the power supply wire and the substrate or well potential wire are shared between adjacent ones of the cell lines, the reinforcing power supply cell is arranged in every second cell line of the plurality of the cell lines. Thus, an object of independent supply of a stable potential as a substrate or well potential from a power supply potential can be achieved and also the number of reinforcing power supply cells to be arranged can be reduced. Accordingly, a region for arranging other cells is increased, thus resulting in reduction in chip area.

As has been described, according to the present invention, in a structure in which a substrate or well potential can be supplied as a separate and independent potential from a power supply potential, the substrate or well potential or the power supply potential can be stabilized without causing increase in layout area.

BRIEF DESCRIPTION OF THE DRAWINGS

FIG. 1A is a plan view of the layout structure; and FIGS. 1B, 1C and 1D are cross-sectional view of the layout structure.

FIG. 2A is a plan view of the layout structure; and FIGS. 2B, 2C, 2D and 2E are cross-sectional views of the layout structure.

FIG. 4A is a plan view of the layout structure; and FIGS. 4B, 4C and 4D are cross-sectional views of the layout structure.

FIG. 5A is a plan view of the layout structure; FIGS. 5B, 5C and 5D are cross-sectional views of the layout structure; and FIG. 5E is a plan view of a reinforcing power supply cell according to a modified example of the third embodiment of the present invention.

FIGS. 6A through 6G are views illustrating a layout structure of a reinforcing power supply cell according to a fourth embodiment of the present invention; FIG. 6A is a plan view of the layout structure, FIGS. 6B, 6C, 6D, 6E, 6F and 6G are cross-sectional views of the layout structure.

FIGS. 8A through 8G are views illustrating another layout structure of a reinforcing power supply cell according to the fourth embodiment of the present invention: FIG. 8A is a plan view of the layout structure; and FIGS. 8B, 8C, 8D, 8E, 8F and 8G are cross-sectional views of the layout structure.

FIGS. 12A through 12E are views illustrating an exemplary known cell layout structure: FIG. 12A is a plan view of the layout structure; and FIGS. 12B, 12C, 12D and 12E are cross-sectional views of the layout structure.

FIGS. 13A through 13E are views illustrating an exemplary layout structure of a known reinforcing power supply cell: FIG. 13A is a plan view of the layout structure; and FIGS. 13B, 13C, 13D and 13E are cross-sectional views of the layout structure.

FIG. 16A is plan view of the layout structure; and FIGS. 16B, 16C, 16D and 16E are cross-sectional views of the layout structure.

FIG. 18 is a plan view illustrating a layout structure of a semiconductor device when the first and second embodiments of the present invention are combined.

DESCRIPTION OF THE PREFERRED EMBODIMENTS

Hereafter, embodiments of the present invention will be described with reference to the accompanying drawings.

First Embodiment

Figure 1B:
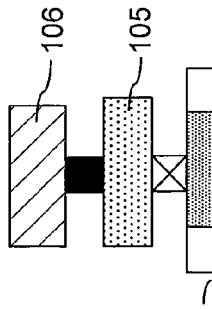
FIGS. 1A through 1D are views illustrating a layout structure of a reinforcing power supply cell according to a first embodiment of the present invention.
Figure 1C:
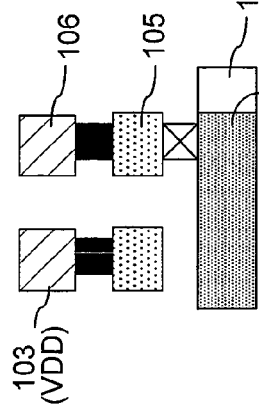
Figure 1D:
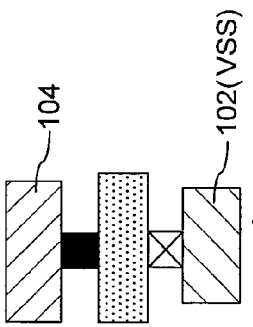
Figure 1A:
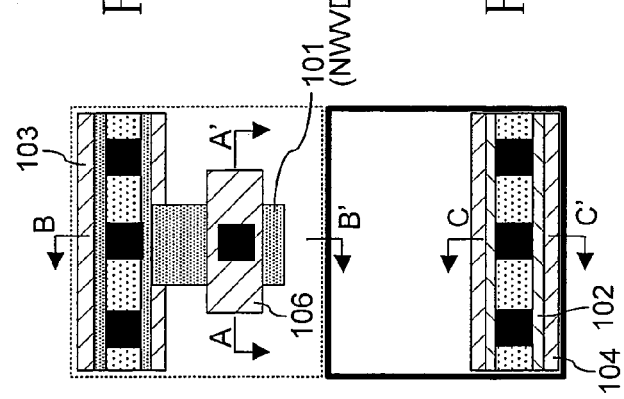

FIGS. 1A through 1D are views illustrating a layout structure of a reinforcing power supply cell according to this embodiment. FIG. 1A is a plan view of the layout structure. FIG. 1B is a cross-sectional view taken along the line A-A' of FIG. 1A. FIG. 1C is a cross-sectional view taken along the line B-B' of FIG. 1A. FIG. 1D is a cross-sectional view taken along the line C-C' of FIG. 1A.

Figure 2C:
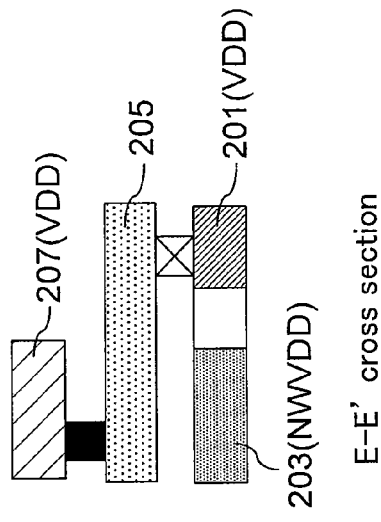
FIGS. 2A through 2E are views illustrating a layout structure of a cell constituting a semiconductor device according to the first embodiment of the present invention.
Figure 2E:
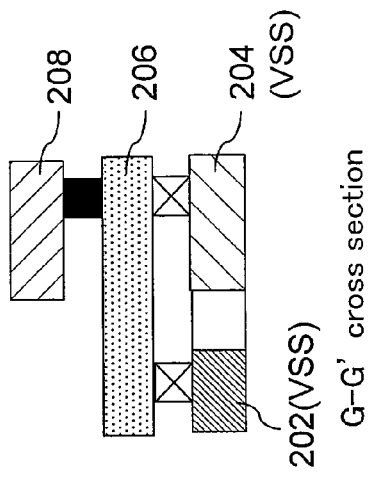
Figure 2B:
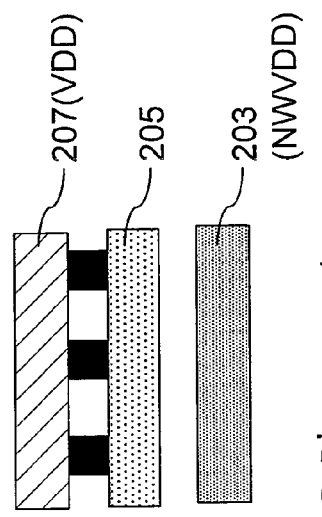
Figure 2D:
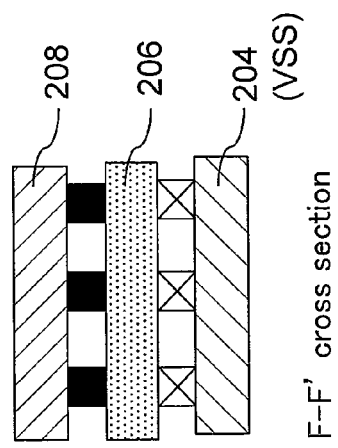
Figure 2A:
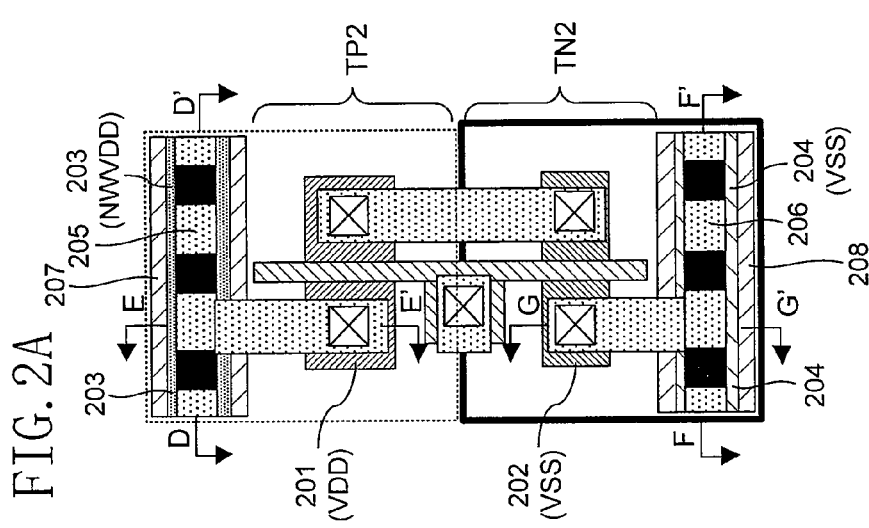

FIGS. 2A through 2E are views illustrating a layout structure of a cell constituting a semiconductor device according to this embodiment. FIG. 2A is a plan view of the layout structure. FIG. 2B is a cross-sectional view taken along the line D-D' of FIG. 2A. FIG. 2C is a cross-sectional view taken along the line E-E' of FIG. 2A. FIG. 2D is a cross-sectional view taken along the line F-F' of FIG. 2A. FIG. 2E is a cross-sectional view taken along the line G-G' of FIG. 2A.

The cell of FIGS. 2A through 12E is formed so as to have a structure in which in an n-well side, i.e., a p-type transistor arranging region, a positive power supply potential VDD and a substrate or well potential NWVDD can be separately supplied. On the other hand, in a p-well side, i.e., an n-type transistor arranging region, a substrate or well potential is made to be the same as a ground potential VSS. The reinforcing power supply cell of FIGS. 1A through 1D corresponds to a cell having the layout structure of FIGS. 2A through 2E.

In FIG. 2A, TP2 is a PMOS including a source and a drain which are formed of a high concentration p-type impurity doped region 201 on an n-well and a gate electrode, and TN2 is an NMOS including a source and a drain formed of a high concentration n-type impurity doped region 202 on a p-well and a gate electrode.

203 denotes a high concentration n-type impurity doped region for supplying a substrate or well potential of the PMOS TP2, which is formed separately from the high concentration p-type impurity doped region 201 on the n-well. 204 denotes a high concentration p-type impurity doped region for supplying a substrate or well potential of the NMOS TN2, which is formed separately from the high concentration n-type impurity doped region 202 on the p-well.

First and second wiring layers are formed above a substrate layer. In the second wiring layer, a VDD wire 207 is above the high concentration n-type impurity doped region 203 and a VSS wire 208 is provided above the high concentration p-type impurity doped region 204. In the first wiring, a wire 205 electrically connected to the VDD wire 207 via contact holes and a wire 206 electrically connected to the VSS wire 208 and the high concentration p-type impurity doped region 204 via contact holes are provided. For convenience of illustration, in FIG. 2A, the high concentration n-type impurity doped region 203 and the wire 205 are illustrated in priority to the VDD wire 207, and the high concentration p-type impurity doped region 204 and the wire 206 are illustrated in priority to the VSS wire 208 (the same applied to other drawings). For connection between layers, see the cross-sectional views of FIGS. 2B through 2E as appropriate.

A potential NWVDD is supplied as a substrate or well potential from the n-type impurity doped region 203 to the PMOS TP2. The VDD wire 207 and the p-type impurity doped region 201 are connected to one another via a contact hole and the wire 205 provided in the first wiring layer. Thus, a positive power supply potential VDD is supplied as a source potential of the PMOS TP2.

The VSS wire 208, the n-type impurity doped region 202 and the p-type impurity doped region 204 are connected via contact holes and the wire 206 provided in the first wiring layer, so that a potential which is the same as the ground potential VSS is supplied as a substrate or well potential from the p-type impurity doped region 204 to the NMOS TN2 and also the ground potential VSS is supplied as a source potential to the NMOS TN2.

As shown in FIG. 1A, in the reinforcing power supply cell, a high concentration n-type impurity doped region 101 is provided as a power supply impurity doped region on an n-well. The power supply impurity doped region 101 is formed so that when the cell of FIGS. 2A through 2E is located adjacent to the reinforcing power supply cell, the power supply impurity doped region 101 is electrically connected to the impurity doped region 203 of the adjacent cell to which a substrate or well potential is supplied. Moreover, a VDD wire 103 is provided in a second wiring layer located above the power supply impurity doped region 101. The VDD wire 103 is formed so that when the cell of FIGS. 2A through 2E is located adjacent to the reinforcing power supply cell, the VDD wire 103 is electrically connected to the VDD wire 207 of the adjacent cell. Furthermore, the power supply impurity doped region 101 is extended to reach a region where the power supply impurity doped region 101 does not overlap with the VDD wire 103, and is connected to power supply wires 105 and 106.

A high concentration impurity doped region 102 is provided above a p-well. The power supply impurity doped region 102 is formed so that when the cell of FIGS. 2A through 2E is located adjacent to the reinforcing power supply cell, the power supply impurity doped region 102 is electrically connected to the impurity doped region 204 to which a substrate or well potential is supplied. Moreover, a VSS wire 104 is provided in the second wiring layer located above the power supply impurity doped region 102. The VSS wire 104 is formed so that when the cell of FIGS. 2A through 2E is located adjacent to the reinforcing power supply cell, the VSS wire 208 of the adjacent cell is electrically connected thereto.

In FIG. 1B, the power supply impurity doped region 101 is connected to the wire 105 provided in the first wiring layer and the wire 106 provided in the second wiring layer via a contact hole. The extended part of the power supply impurity doped region 101 from under the VDD wire 103 is isolated from an adjacent cell by an isolation region 107 such as a STI and thus the wires 105 and 106 connected to the isolation region 107 are isolated form a cell boundary.

As seen from FIG. 1C, the VDD wire 103 and the power supply wire 106 are electrically isolated from one another. Thus, the potential NWVDD which is different from the positive power supply potential VDD can be supplied to the power supply wire 106.

The reinforcing power supply cell of FIGS. 1A through 1D is arranged in a cell line including cells each having the layout structure of FIGS. 2A through 2E as appropriate and a potential is supplied to the power supply wire 106. Thus, a drop of the substrate or well potential can be avoided.

Figure 3:
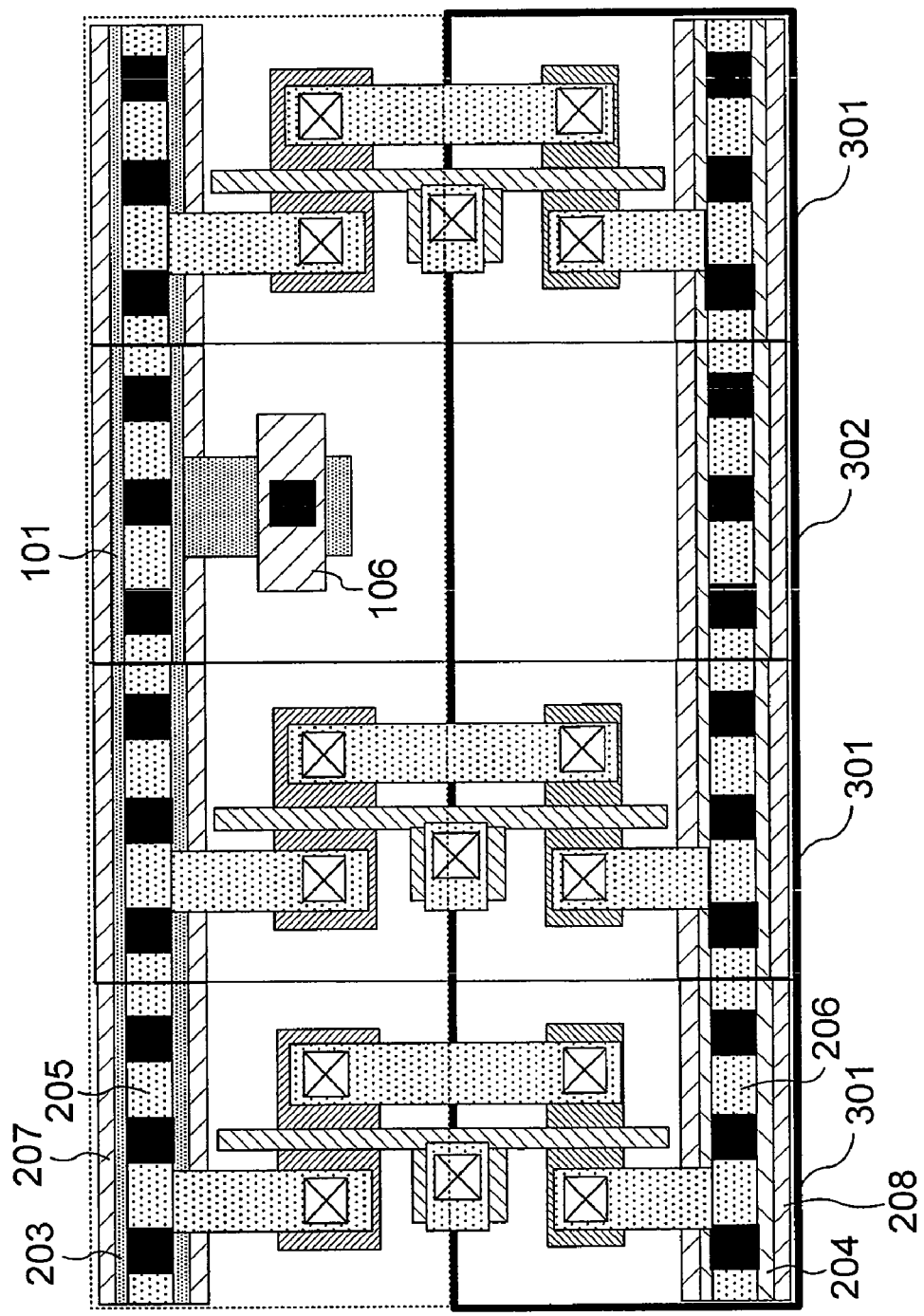
FIG. 3 is a plan view illustrating a layout structure according to the first embodiment of the present invention in which the reinforcing power supply cell of FIGS. 1A through 1D and a cell of the layout structure of FIGS. 2A through 2E are combined.

FIG. 3 is a plan view illustrating a layout structure in which the reinforcing power supply cell of FIGS. 1A through 1D is inserted in the cell line in which the cells of FIGS. 2A through 2E are arranged in series. In FIG. 3, inverters (cells 301) are connected in series in three stages and a reinforcing power supply cell 302 is arranged between the inverters in the second and third stages. In the layout structure of FIGS. 2A through 2E, each of the impurity doped regions 203 and 204 for supplying a substrate or well potential extends from one end to the other end of the cell. Thus, when the cells of FIGS. 2A through 2E are arranged in series, as shown in FIG. 3, the impurity doped regions 203 are continuously connected and the impurity doped regions 204 are continuously connected. In the same manner, each of the VDD wire 207, the VSS wire 208 and the wires 205 and 206 in the first wiring layer connected to the VDD wire 207 and the VSS wire 208, respectively, extends from one end to the other end of the cell. Thus, when the cells are arranged in a line, the continuously connected VDD wires 207, the continuously connected VSS wires 208, the continuously connected wires 205 and the continuously connected wires 206 are provided.

In this case, by arranging the reinforcing power supply cell of FIGS. 1A through 1D between the cells, the potential NWVDD can be supplied as a substrate or well potential from the power supply wire 106. Moreover, even when the reinforcing power supply cell of FIGS. 1A through 1D is arranged between the cells, the continuity of each of the impurity doped regions 203 and 204, the wires 205 and 206, the VDD wire 207 and the VSS wire 208 is not deteriorated in the cell lines.

Second Embodiment

Figure 4A:
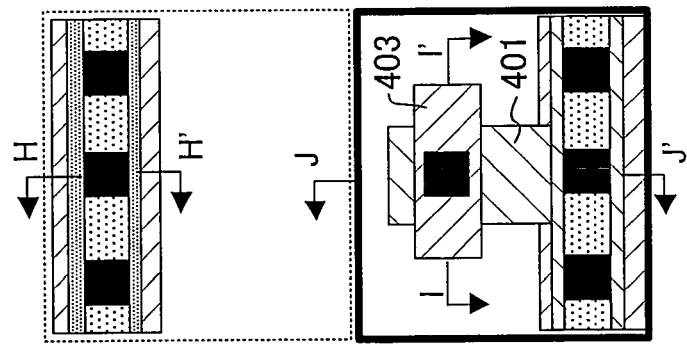
FIGS. 4A through 4D are views illustrating a layout structure of a reinforcing power supply cell according to a second embodiment of the present invention.
Figure 4B:
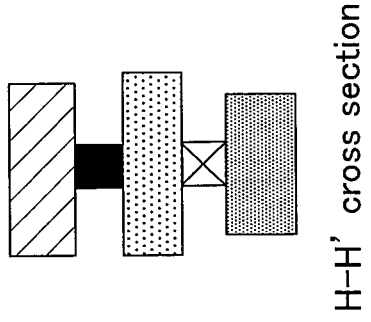
Figure 4C:
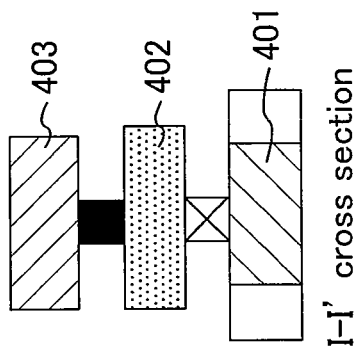
Figure 4D:
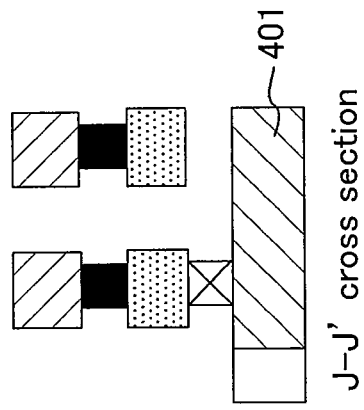

FIGS. 4A through 4D are views illustrating a layout structure of a reinforcing power supply cell according to this embodiment. FIG. 4A is a plan view of the layout structure. FIG. 4B is a cross-sectional view taken along the line H-H' of FIG. 4A. FIG. 4C is a cross-sectional view taken along the line I-I' of FIG. 4A. FIG. 4D is a cross-sectional view taken along the line J-J' of FIG. 4A.

As described in the first embodiment, by combining the reinforcing power supply cell of FIGS. 1A through 1D and the cell of FIGS. 2A through 2E as shown in FIG. 3, a semiconductor device which allows only in a p-transistor arranging region independent supply of the substrate or well potential NWVDD from the positive power supply potential VDD and reinforcement of the substrate or well potential NWVDD can be achieved.

In contrast, by using the reinforcing power supply cell of FIGS. 4A through 4D, a semiconductor device which allows only in an n-type transistor arranging region independent supply of the substrate or well potential PWVSS from the ground potential VSS and reinforcement of the substrate or well potential PWVSS can be achieved. 401 denotes a power supply impurity doped region for supplying the substrate or well potential PWVSS, 402 and 403 denote power supply wires provided in wiring layers, respectively, formed above the power supply impurity doped region 401 and electrically connected to the power supply impurity doped region 401.

Figure 17:
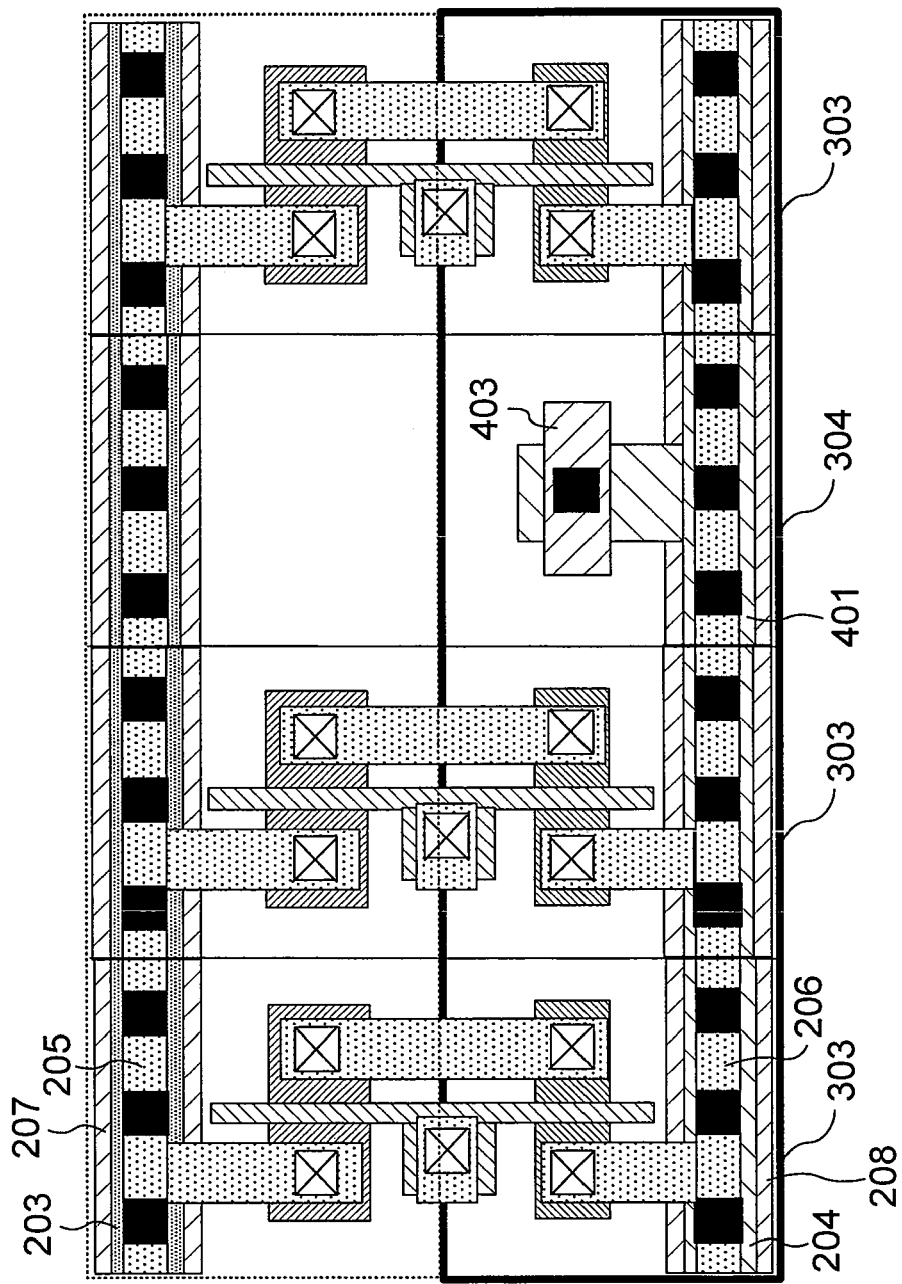
FIG. 17 is a view illustrating a layout structure of a semiconductor device according to the second embodiment of the present invention in which the reinforcing power supply cell of FIGS. 4A through 4D and the cell of FIGS. 16A through 16E are combined.

A layout structure of a cell which exhibits effects by being combined with the reinforcing power supply cell of FIGS. 4A through 4D is different from the layout structure of FIGS. 2A through 2E. Specifically, such a cell has a similar structure to the layout structure of FIGS. 2A through 2E, but the wire 206 and the high concentration p-type impurity doped region 204 are not connected and, on the other hand, the wire 205 and the high concentration n-type impurity doped region 203 are connected. That is, a cell to be combined with the reinforcing power supply cell of FIGS. 4A through 4D is formed so as to have a structure in which a substrate or well potential which is the same as the positive power supply potential VDD is supplied in the p-type transistor arranging region and a substrate or well potential which is different from the ground potential VSS can be supplied in the n-type transistor arranging region. A layout structure of such a cell is shown in FIGS. 16A through 16E. FIG. 17 is a plan view illustrating a layout structure in which the reinforcing power supply cell of FIGS. 4A through 4D is inserted in a cell line in which cells of FIGS. 16A through 16E are arranged in series. In FIG. 17, cells 303 are connected in series in three stages and a reinforcing power supply sell 304 is arranged between the cells 303 in the second stage and the third stage. In this case, the high concentration p-type impurity doped region 204 is electrically connected to the power supply impurity doped region 401 of the reinforcing power supply cell of FIGS. 4A through 4D.

The first embodiment and the second embodiment may be combined. For example, a layout structure in which the reinforcing power supply cell of FIGS. 1A through 1D is inserted in one cell line to allow independent power supply of the substrate or well potential NWVDD from the positive power supply potential VDD and the reinforcing power supply cell of FIGS. 4A through 4D is inserted in another cell line to allow independent power supply of the substrate or well potential PWVSS from the ground potential VSS may be formed. An exemplary layout structure is shown in FIG. 18. A cell line shown in the upper side is the same as that of FIG. 3. A cell line shown in the lower side is the same as that of FIG. 17 and corresponds to a second cell line. In the lower cell line, the cell 303, the reinforcing power supply sell 304, the high concentration p-type impurity doped region 204, the power supply impurity doped region 401 and the power supply wire 403 correspond to a second cell, a second reinforcing power supply cell, a second impurity doped region, a second power supply impurity doped region, and a second power supply wire, respectively.

For example, in a chip design including a plurality of blocks, a design with a high degree of freedom in which a reinforcing power supply cell for the NWVDD side is used in one block and a reinforcing power supply cell for the PWVSS side is used in another block, or the like becomes possible and, as a result, the effect of reduction in layout area can be achieved. Moreover, the reinforcing power supply cell for performing reinforcing power supply in both of a p-type transistor arranging region and an n-type transistor arranging region, which is disclosed in Patent Reference 1, may be combined and used. Thus, a design with a further high degree of freedom becomes possible.

Third Embodiment

Figure 5A:
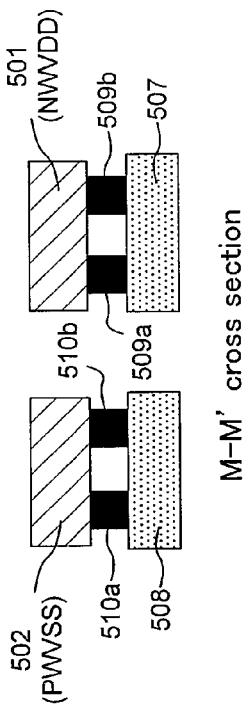
FIGS. 5A through 5E are views illustrating a layout structure of a reinforcing power supply cell according to a third embodiment of the present invention.
Figure 5B:
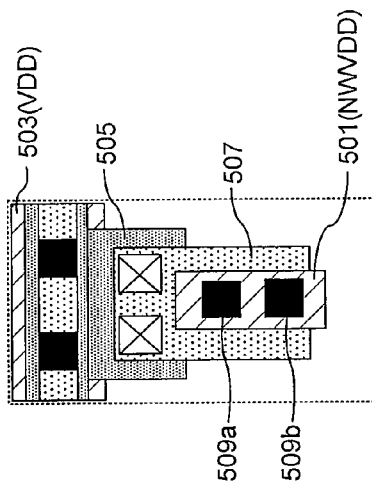
Figure 5C:
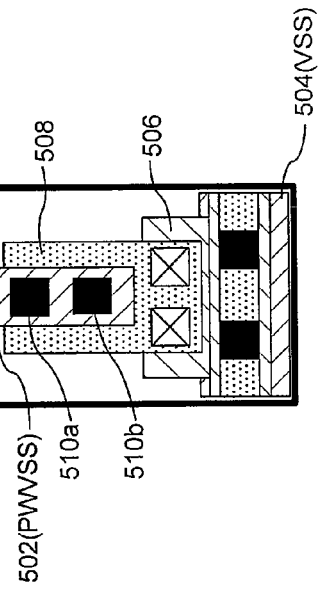
Figure 5D:
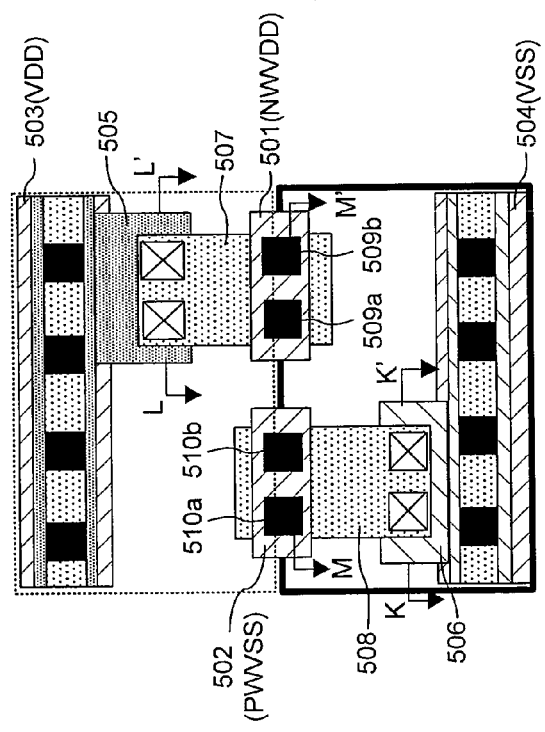
Figure 5E:
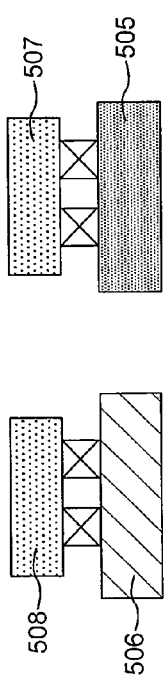

FIGS. 5A through 5E are views illustrating a layout structure of a reinforcing power supply cell according to this embodiment. FIG. 5A is a plan view of the layout structure. FIG. 5B is a cross-sectional view taken along the line K-K' of FIG. 5A. FIG. 5C is a cross-sectional view taken along the line L-L' of FIG. 5A. FIG. 5D is a cross-sectional view taken along the line M-M' of FIG. 5A. FIG. 5E is a plan view illustrating a layout structure of a reinforcing power supply cell according to a modified example of the third embodiment.

The reinforcing power supply cell of FIGS. 5A through 5D corresponds to a cell having a layout structure of FIGS. 12A through 12E, i.e., a layout structure obtained by combination of the reinforcing power supply cell of FIGS. 1A through 1D and the reinforcing power supply cell of FIGS. 4A through 4D.

Figure 19:
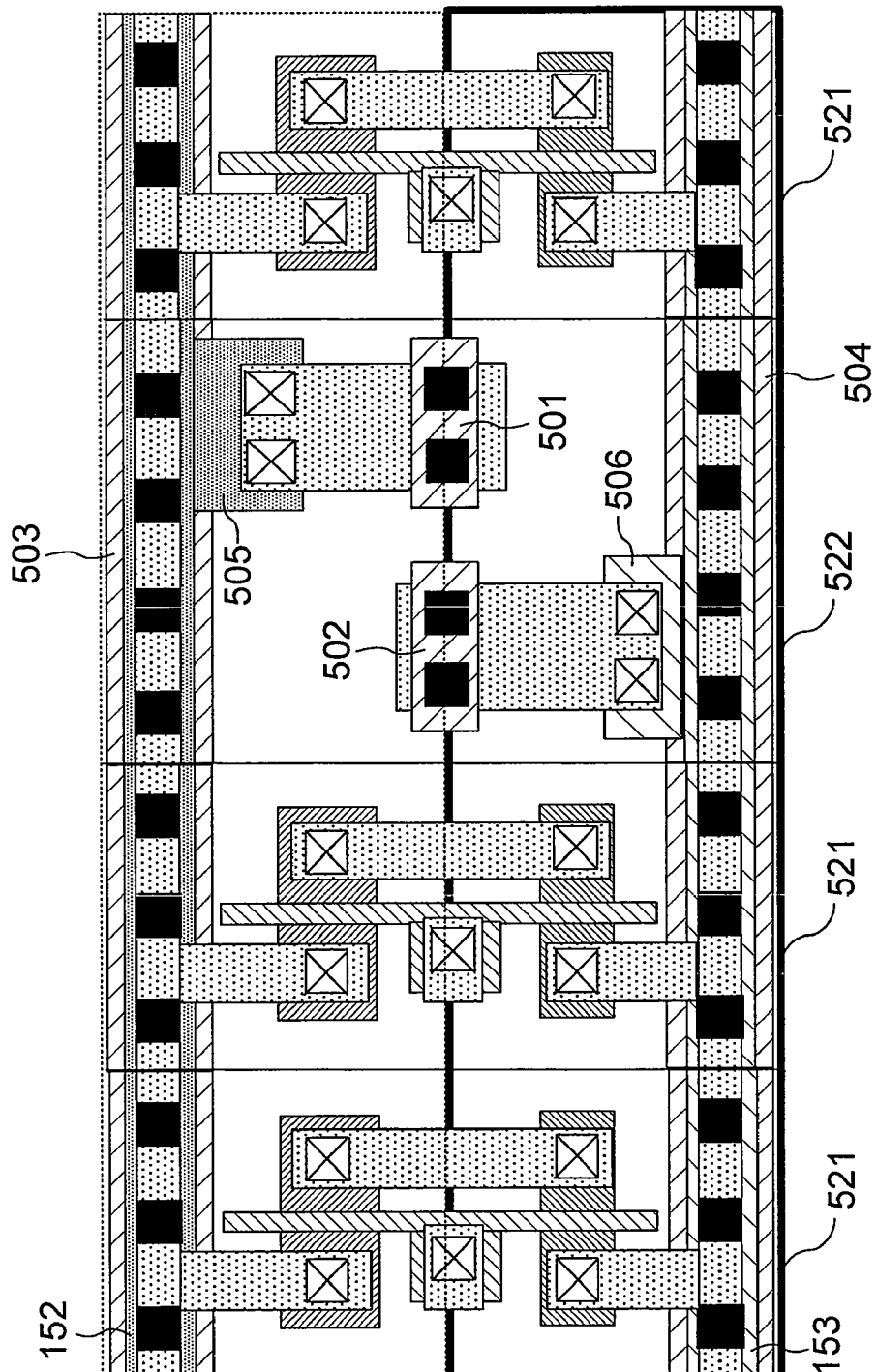
FIG. 19 is a plan view illustrating a layout structure of a semiconductor device according to the third embodiment of the present invention, in which the reinforcing power supply cell of FIGS. 5A through 5D and the cell of FIGS. 12A through 12E are combined.

Specifically, a first power supply impurity doped region 505 is electrically connected to the high concentration n-type impurity doped region 152 as a first impurity doped region when the cell of FIGS. 12A through 12E is located adjacent thereto. A second power supply impurity doped region 506 is electrically connected to the high concentration p-type impurity doped region 153 as a second impurity doped region when the cell of FIGS. 12A through 12E is located adjacent thereto. In a first wiring layer formed above the first and second power supply impurity doped regions 505 and 506, a first power supply wire 507 electrically connected to the first power supply impurity doped region 505 via contact holes and a second power supply wire 508 electrically connected to the second power supply impurity doped region 506 via contact holes are provided. Furthermore, in a second wiring layer formed above the first and second first power supply wires 507 and 508, a first pin 501 electrically connected to the first power supply wire 507 via contact holes 509a and 509b and a second pin 502 electrically connected to the second power supply wire 508 via contact holes 510a and 510b are provided. The potential NWVDD is supplied to the first pin 501 and the potential PWVSS is supplied to the second pin 502.

Where a Y axis extends in the direction perpendicular to long sides of a VDD wire 503 and a VSS wire 504, the first and second pins 501 and 502 formed in the second wiring layer are arranged on the same Y-coordinate. In other words, when the reinforcing power supply cell of FIGS. 5A through 5D is inserted in a cell line, the first and second pins 501 and 502 are arranged on the same straight line in parallel to the direction of alignment of cells. A layout structure in this case is shown in FIG. 19. In FIG. 19, cells 521 each having the layout structure of FIGS. 12A through 12E are connected in series in three stages and a reinforcing power supply cell 522 having the layout structure of FIGS. 5A through 5D is arranged between the second and third cells 521. Thus, in the second wiring layer, blank regions are created between the VDD wire 503 and the first pin 501 and between the VSS wire 504 and the second pin 502. The blank regions can be effectively utilized for connection between cells arranged adjacent to one another, thus resulting in reduction in chip area.

Moreover, a width of each of the first and second pins 501 and 502 in the direction perpendicular to the alignment of the cells is preferably set to be the minimum allowable width according to the process rule. Thus, a wiring area in the second wiring layer of the reinforcing power supply cell can be further reduced, thus resulting in reduction in chip area.

Alternatively, an electrical connection between the first power supply wire 507 and the first pin 501 and an electrical connection between the second power supply wire 508 and the second pin 502 are preferably made using two or more contact holes for each of the electrical connections. Thus, an increased redundancy of connections can be achieved and the reliability of an LSI operation can be increased.

Figure 20:
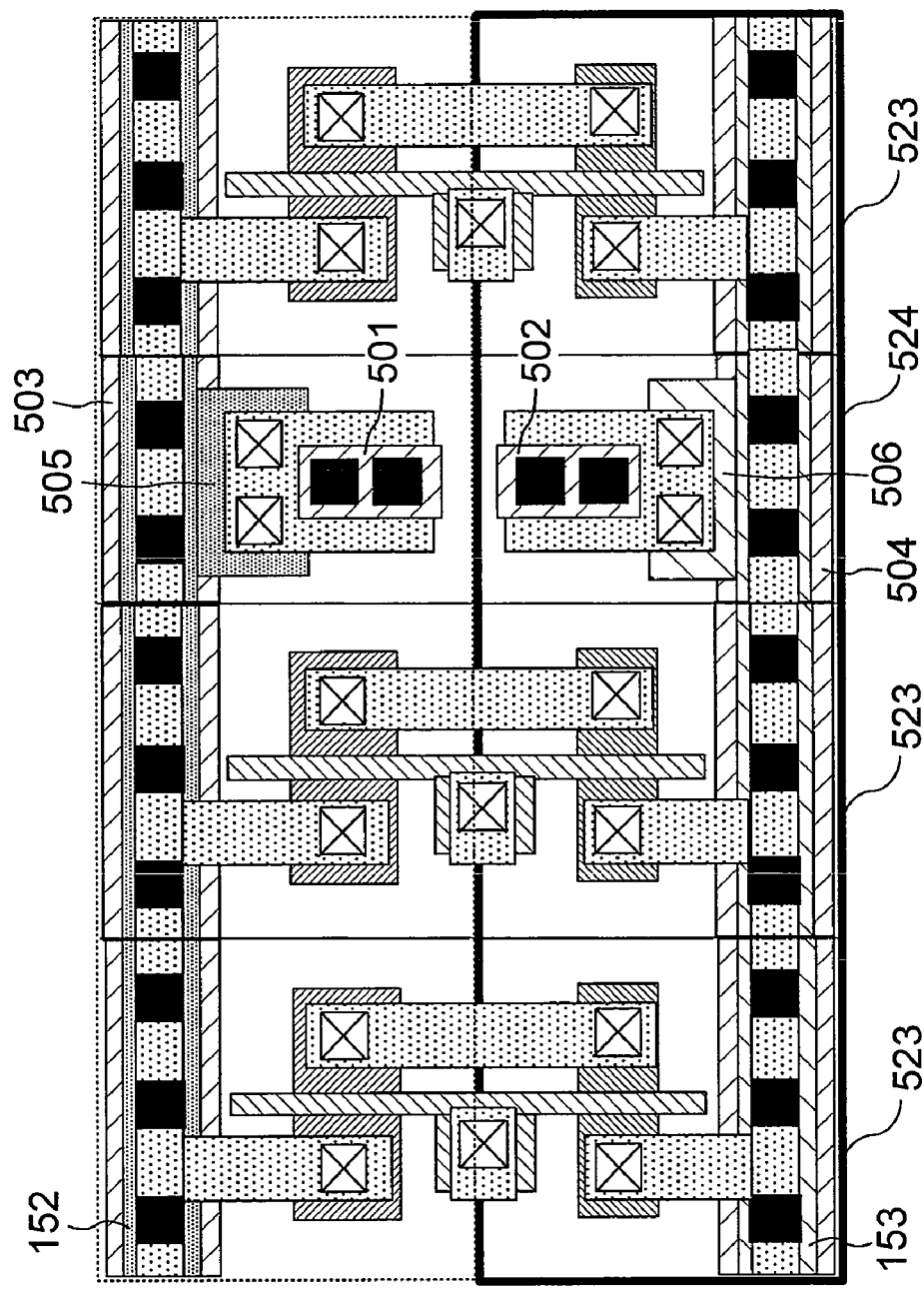
FIG. 20 is a plan view illustrating a layout structure of a semiconductor device according to the modified example of the third embodiment of the present invention, in which the reinforcing power supply cell of FIG. 5E and the cell of FIGS. 12A through 12E are combined.

Moreover, as shown in FIG. 5E, in the reinforcing power supply cell of the modified example of this embodiment, the first and second pins 501 and 502 are arranged on the same straight line perpendicular to the direction of the alignment of the cells. A layout structure in this case is shown in FIG. 20. In FIG. 20, cells 523 each having the layout structure of FIGS. 12A through 12E are connected in series in three stages and a reinforcing power supply cell 524 of FIG. 5E is arranged between the second and third cells 523. Also, in this case, a width of each of the first and second pins 501 and 502 is preferably set to be a minimum allowable width according to the process rule. Thus, a wiring area in the second wiring layer of the reinforcing power supply cell can be further reduced, thus resulting in reduction in chip area.

Alternatively, an electrical connection between the first power supply wire 507 and the first pin 501 and an electrical connection between the second power supply wire 508 and the second pin 502 are preferably made using two or more contact holes for each of the electrical connections. Thus, an increased redundancy of connections can be provided and the reliability of an LSI operation can be increased.

Fourth Embodiment

FIGS. 6A through 6G are views illustrating a layout structure of a reinforcing power supply cell according to this embodiment. FIG. 6A is a plan view of the layout structure. FIG. 6B is a cross-sectional view taken along the line N-N' of FIG. 6A. FIG. 6C is a cross-sectional view taken along the line O-O' of FIG. 6A. FIG. 6D is a cross-sectional views taken along the line P-P' of FIG. 6A. FIG. 6E is a cross-sectional view taken along the line Q-Q' of FIG. 6A. FIG. 6F is a cross-sectional view taken along the line R-R' of FIG. 6A. FIG. 6G is a cross-sectional view taken along the line S-S' of FIG. 6A.

The reinforcing power supply cell of FIGS. 6A through 6G corresponds to a cell having the layout structure of FIGS. 12A through 12E. Specifically, this reinforcing power supply cell is inserted in a line of cells of FIGS. 12A through 12E arranged in series, a power supply impurity doped region 603 is electrically connected to a high concentration n-type impurity doped region 152 of an adjacent cell thereto and a power supply impurity doped region 604 is electrically connected to a high concentration p-type impurity doped region 153 of an adjacent cell thereto.

In a first wiring layer formed above the power supply impurity doped regions 603 and 604, first power supply wires 605 and 606 electrically connected to the power supply impurity doped regions 603 and 604, respectively, are provided. Furthermore, in a second wiring layer formed above the first power supply wires 605 and 606, second power supply wires 601 and 602 connected to the first power supply wires 605 and 606, respectively, are provided.

Each of the second power supply wires 601 and 602 extends to reach one end of the reinforcing power supply cell in the direction perpendicular to the direction of alignment of the cells. Specifically, the second power supply wire 601 for supplying the potential NWVDD extends crossing over the power supply impurity doped region 604 to reach a lower end of the reinforcing power supply cell. On the other hand, the second power supply wire 602 for supplying the potential PWVSS extends crossing over the power supply impurity doped region 603 to reach an upper end of the reinforcing power supply cell.

In the first wiring layer, wires 607 and 608 are provided. The wire 607 overlaps with the power supply impurity doped region 603 and the wire 608 overlaps with the power supply impurity doped region 604. Then, the second power supply wire 601 is provided so as to have part overlapping with the power supply impurity doped region 604 and the wire 608 and the second power supply wire 602 is provided so as to have part overlapping with the power supply impurity doped region 603 and the wire 607.

Figure 7:
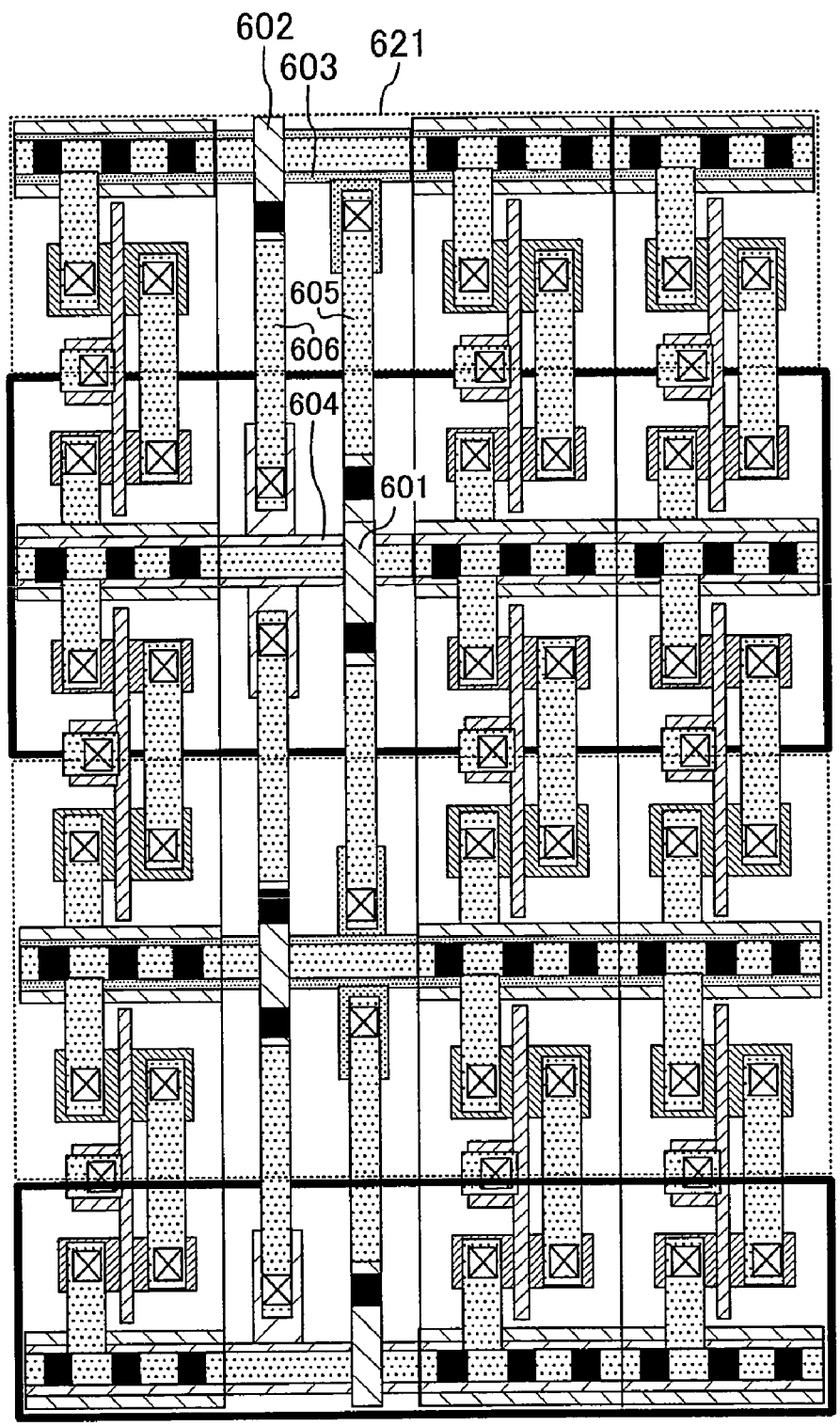
FIG. 7 is a plan view illustrating a layout structure of a semiconductor device according to the fourth embodiment of the present invention in which the reinforcing power supply cell of FIGS. 6A through 6G and the cell of the layout structure of FIGS. 12A through 12E are combined.

There are two major differences between the reinforcing power supply cell of FIGS. 6A through 6G and the reinforcing power supply cell of FIGS. 13A through 13E. A first difference is that, as shown in FIG. 7, when reinforcing power supply cells 621 of FIGS. 6A through 6G are continuously arranged in the up-to-down direction, power supply wires for supplying the potential NWVDD can be connected to one another and power supply wires for supplying the potential PWVSS can be connected to one another in a simple manner between adjacent reinforcing power supply cells 621 connected in the up-to-down direction. In the case of the known reinforcing power supply cell, to connect NWVDD wires to one another and PWVSS wires to one another between a plurality of reinforcing power supply cells, for example, another wire have to be provided in the second wiring layer. In contrast, in the case of the reinforcing power supply cell of this embodiment, only by arranging a plurality of reinforcing power supply cells in the up-to-down direction, connection between NWVDD wires and connection between PWVSS wires can be completed. Therefore, there is no need to provide another wire and thus high area efficiency can be achieved.

A second difference is that, when the reinforcing power supply cell of FIGS. 6A through 6G is located adjacent to a cell having the layout structure of FIGS. 12A through 12E, second wiring layer part of the power supply wire 105 and second wiring layer part of the VSS wire 151 are segmented in the reinforcing power supply cell. Thus, each of the segmented VDD and VSS wires has to be connected to a power supply main line in an upper layer. However, if an interval between power supply main lines is smaller than that between reinforcing power supply cells, disadvantages are not particularly caused.

FIGS. 8A through 8G are views illustrating another layout structure of a reinforcing power supply cell according to this embodiment. FIG. 8A is a plan view of the layout structure. FIG. 8B is a cross-sectional view taken along the line T-T' of FIG. 8A. FIG. 8C is a cross-sectional view taken along the line U-U' of FIG. 8A. FIG. 8D is a cross-sectional view taken along the line V-V' of FIG. 8A. FIG. 8E is a cross-sectional view taken along the line W-W' of FIG. 8A. FIG. 8F is a cross-sectional view taken along the line X-X' of FIG. 8A. FIG. 8G is a cross-sectional view taken along the line Y-Y' of FIG. 8A. Note that each member also shown in FIGS. 6A through 6G is identified by the same reference numeral.

In the layout structure of FIGS. 8A through 8G, in contrast to the layout structure of FIGS. 6A through 6G, third power supply wires 801 and 802 are additionally provided in the second wiring layer. The third power supply wire 801 for supplying the potential NWVDD extends crossing over the power supply impurity doped region 603 to reach an upper end of the reinforcing power supply cell. On the other hand, the third power supply wire 802 for supplying the potential PWVSS extends crossing over the power supply impurity doped region 604 to reach a lower end of the reinforcing power supply cell. That is, each of the third power supply wires 801 and 802 extends to reach the other end of the reinforcing power supply cell in the direction perpendicular to the alignment of cells than one end which each of the second power supply wires 601 and 602 reaches.

Figure 9:
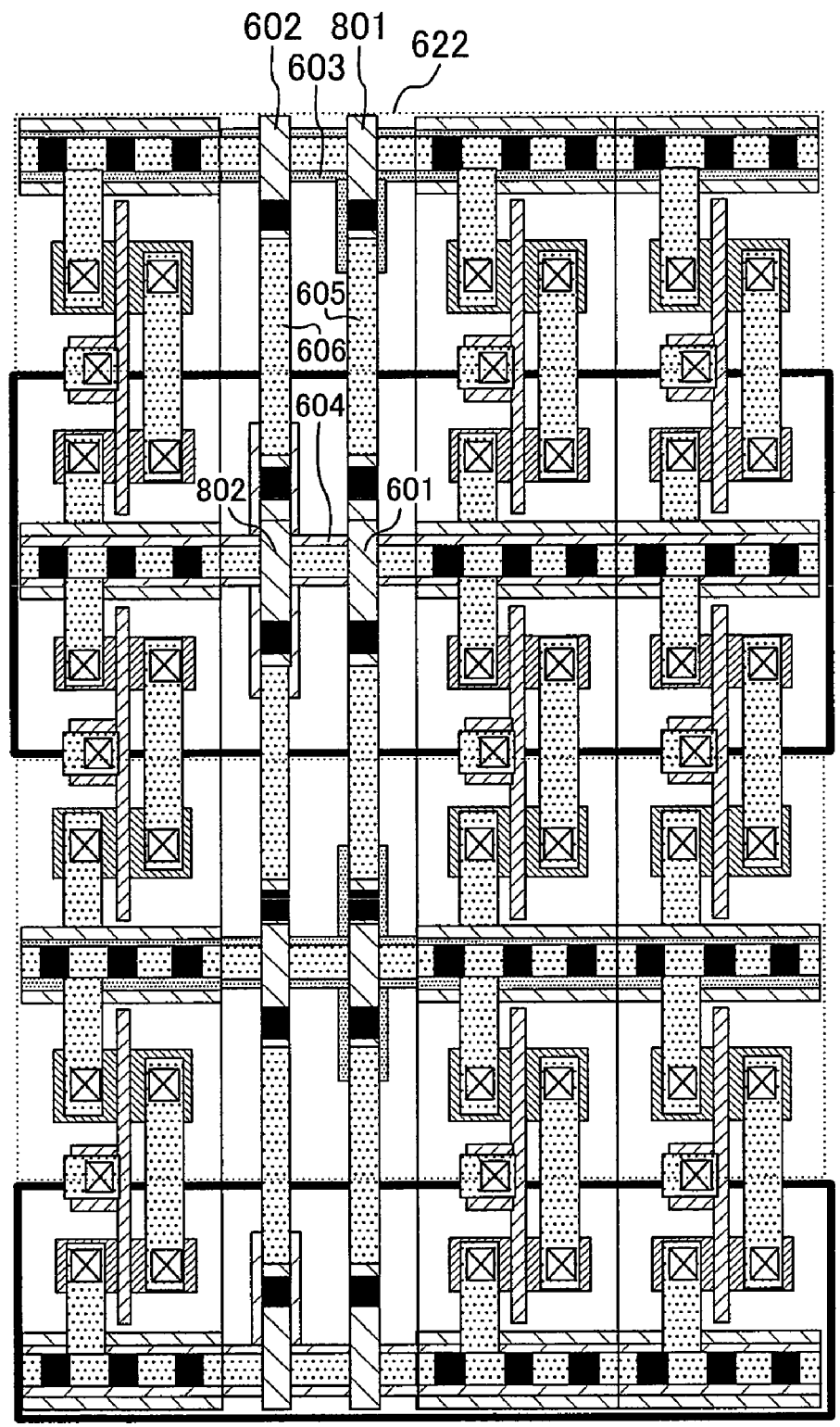
FIG. 9 is a plan view illustrating a layout structure of a semiconductor device according to the fourth embodiment of the present invention in which the reinforcing power supply cell of FIGS. 8A through 8G and the cell of the layout structure of FIGS. 12A through 12E are combined.

As shown in FIG. 9, when reinforcing power supply cells 622 of FIGS. 8A through 8G are continuously arranged in the up-to-down direction, power supply wires for supplying the potential NWVDD can be connected to one another and power supply wires for supplying the potential PWVSS can be connected to one another between adjacent reinforcing power supply cells 622 connected in the up-to-down direction. Thus, the resistance of power supply wires can be reduced and a more stable potential can be supplied as a substrate or well potential.

Fifth Embodiment

Figure 10:
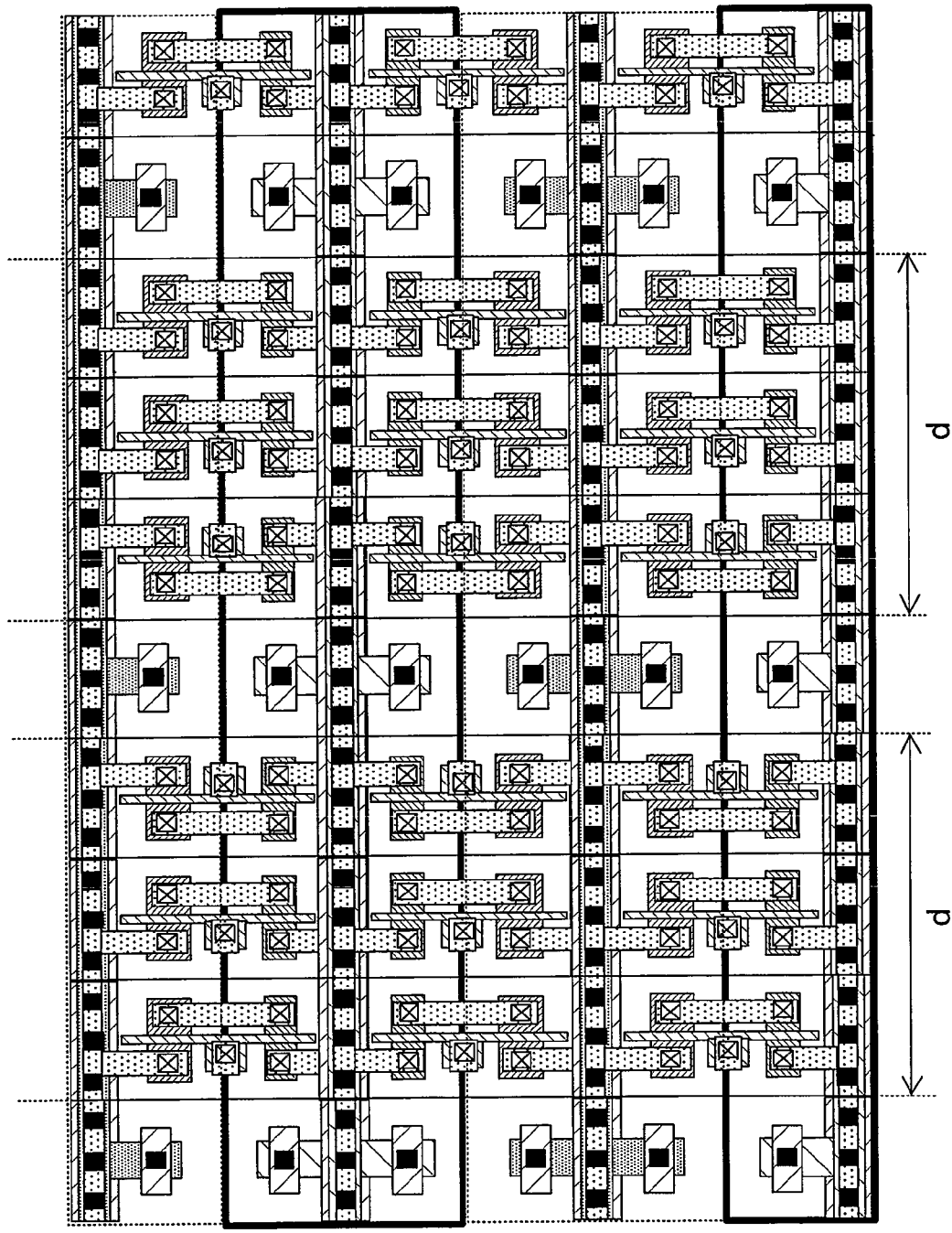
FIG. 10 is a plan view illustrating a layout structure of a semiconductor device according to a fifth embodiment of the present invention.

FIG. 10 is a view illustrating a layout structure of a semiconductor device using a reinforcing power supply cell according to this embodiment. FIG. 10 illustrates a structure in which the known reinforcing power supply cell of FIGS. 13A through 13E is inserted in each cell line in which cells of FIGS. 12A through 12E are arranged. As shown in FIG. 10, in each cell line in a cell region, which includes a plurality of cell lines, reinforcing power supply cells are arranged at regular intervals (interval d). Thus, a length of a section in the cell region which is sandwiched between the reinforcing power supply cells and to which a substrate or well potential is supplied only by an impurity doped region can be limited. Therefore, a potential drop caused in the section can be suppressed, so that a stable potential can be independently supplied as a substrate or well potential from a power supply potential. Accordingly, fluctuation in threshold of a transistor or the like is not caused and the reliability of an LSI operation is increased, so that a stand-by leakage current can be effectively suppressed.

In a design flow using an automatic placer and router, if reinforcing power supply cells are arranged at regular intervals and then other cells are arranged in blank regions, a desired layout structure can be achieved without largely increasing the number of process steps of a layout design. Moreover, a wiring region necessary for connecting reinforcing power supply cells to power supply main lines can be suppressed to a minimum size, thus resulting in reduction in chip area. Note that a "power supply main line" herein means, in general, a wire formed in a lattice shape in an upper layer of a multilayer wire for the purpose of supplying a power supply potential. In many cases, a width of a power supply main line is set to be large to prevent a potential drop.

Note that in FIG. 10, the structure in which the known reinforcing power supply cell of FIGS. 13A through 13E is inserted in each cell line in which the cells of FIGS. 12A through 12E are arranged is illustrated. However, a structure in which a reinforcing power supply cell according to each of the above-described embodiments is inserted may be used.

Sixth Embodiment

Figure 11B:
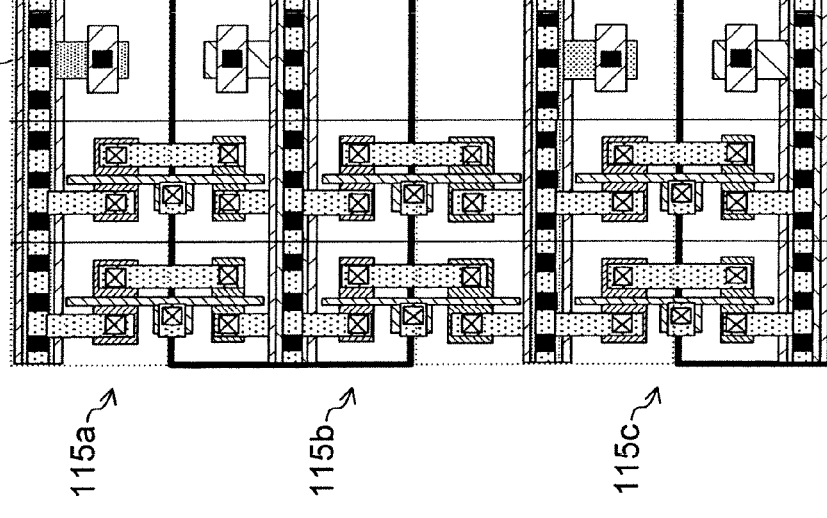
FIG. 11A is a view illustrating a layout structure of a known semiconductor device and FIG. 11B is a view illustrating a layout structure of a semiconductor device according to a sixth embodiment of the present invention.
Figure 11A:
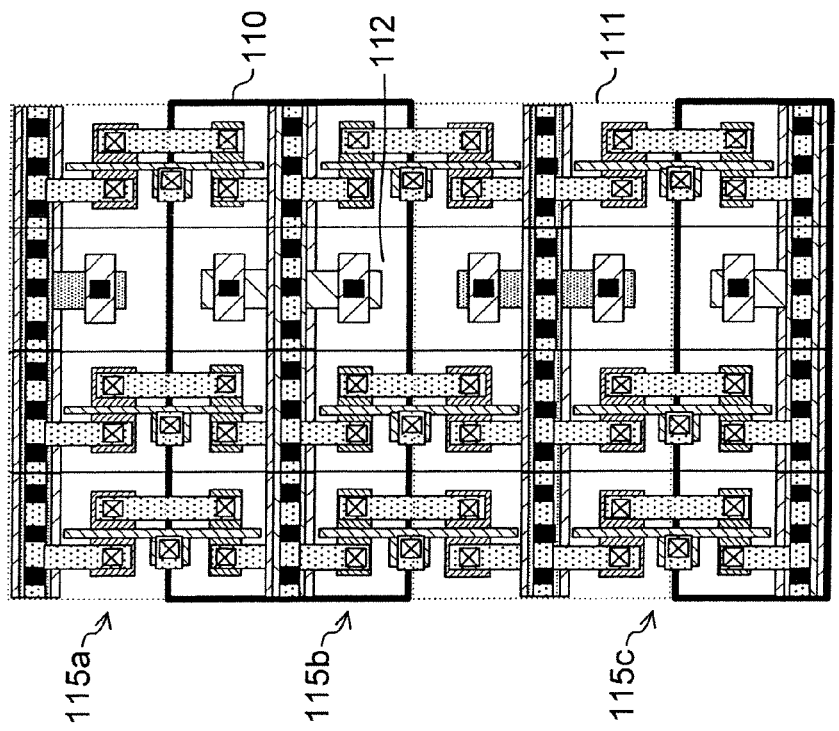
Figure 14:
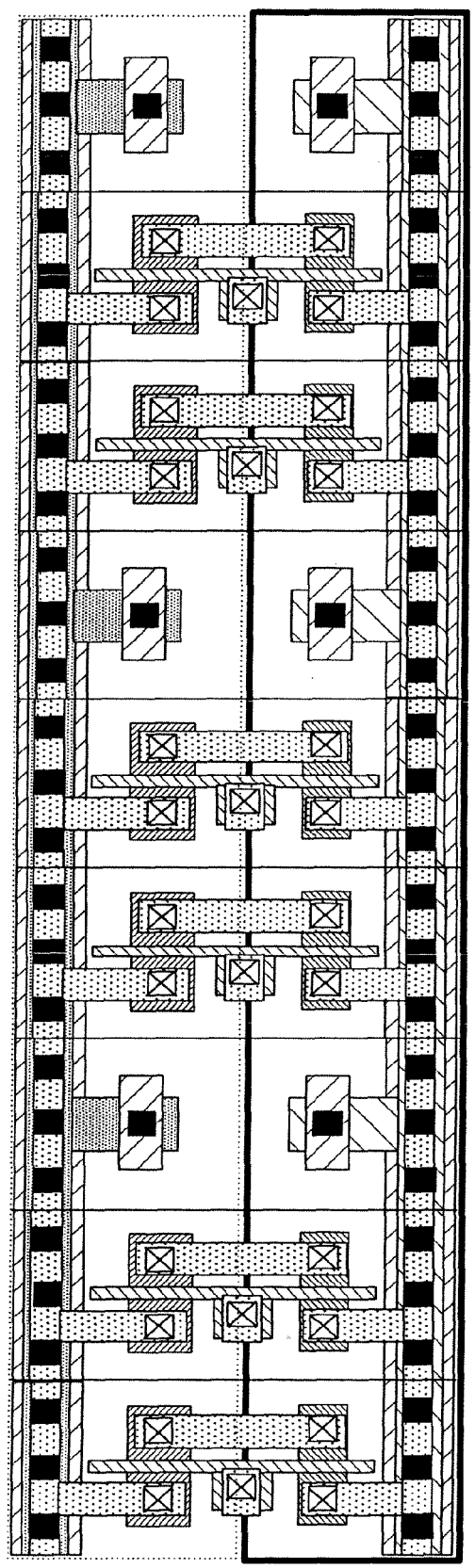
FIG. 14 is a view illustrating an exemplary known layout structure in which the reinforcing power supply cell of FIGS. 13A through 13E and the cell of FIGS. 12A through 12E are combined.
Figure 15B:
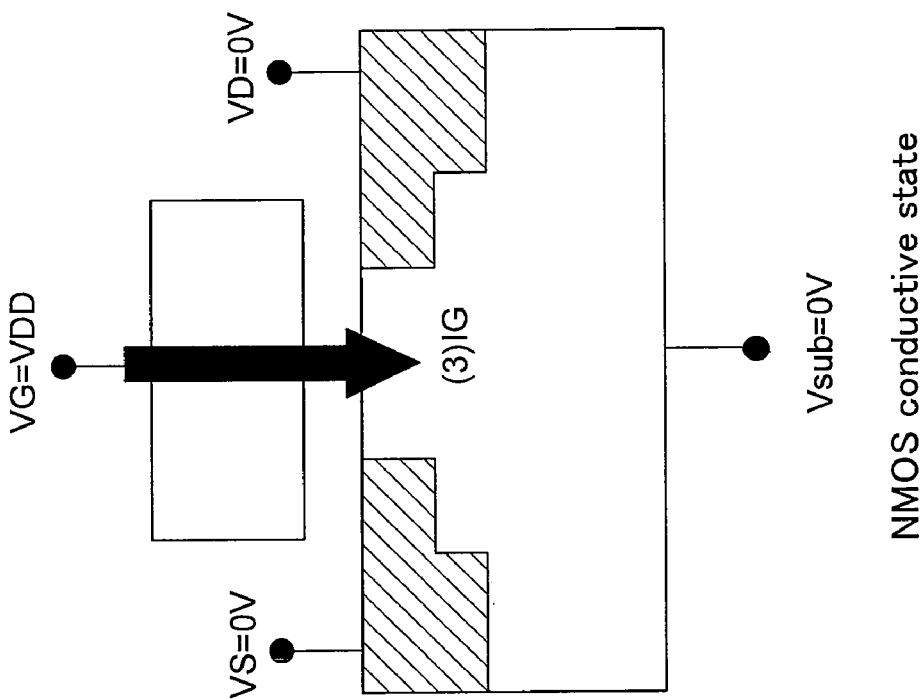
FIGS. 15A and 15B are schematic views of an NMOS transistor describing three components constituting a leakage current.
Figure 15A:
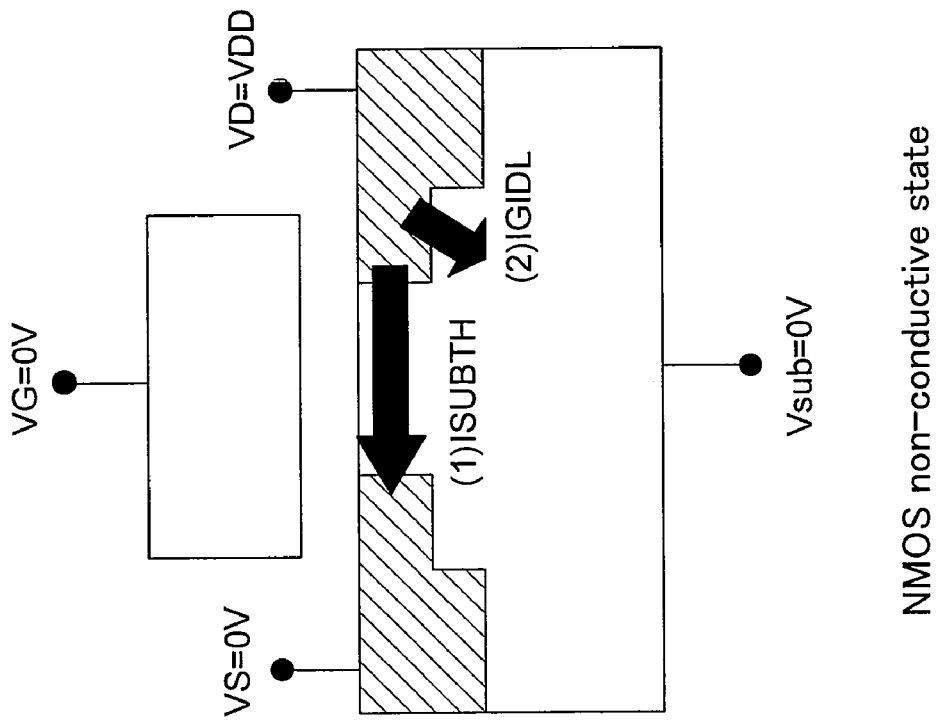
Figure 16C:
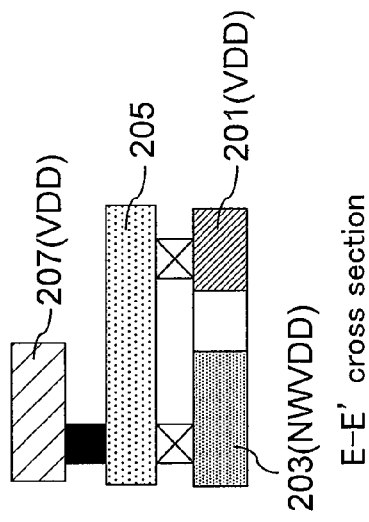
FIGS. 16A through 16E are views illustrating a layout structure of a cell constituting a semiconductor device according to the second embodiment of the present invention.
Figure 16B:
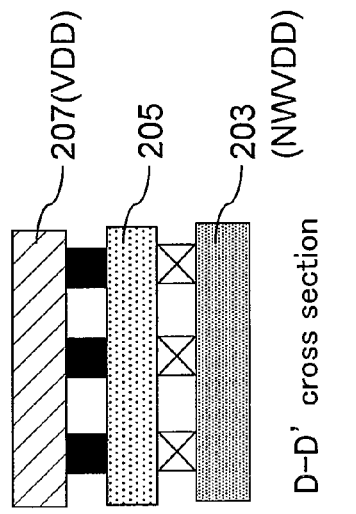
Figure 16E:
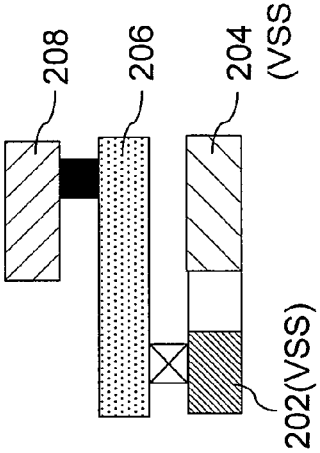
Figure 16D:
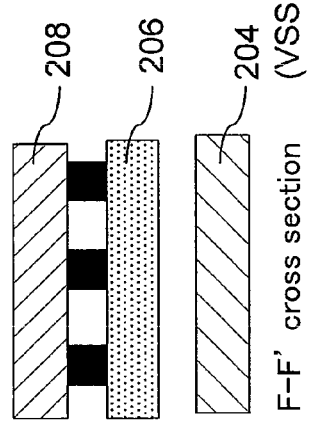
Figure 16A:
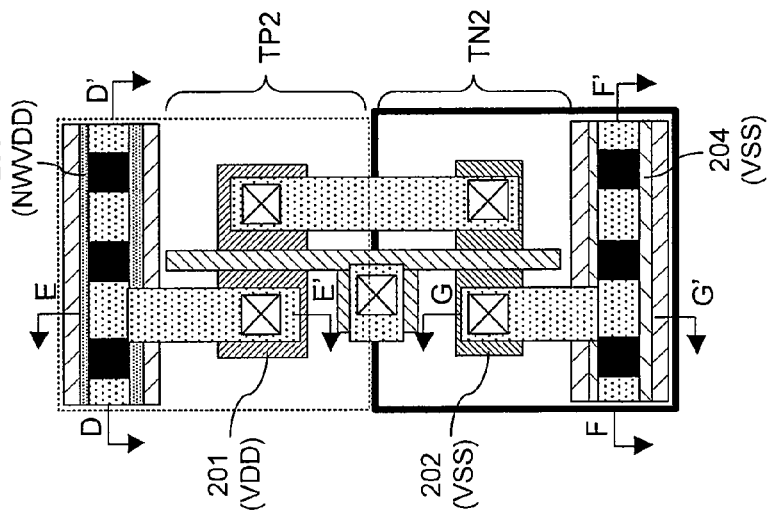

FIGS. 11A and 11B are views illustrating a layout structure of a semiconductor device using a reinforcing power supply cell. In each of FIGS. 11A and 11B, the known reinforcing power supply cell of FIGS. 13A through 13E is inserted in cell lines in which cells of FIGS. 12A through 12E are arranged. In a plurality of cell lines 115a, 115b and 115c, arrangement of a p-type transistor arranging region and an n-type transistor arranging region is inverted in every second cell line, and a power supply wire and a substrate or well potential wire are shared between adjacent cell lines. FIG. 11A illustrates a known layout structure and FIG. 11B illustrates an exemplary layout structure of this embodiment.

In general, in a layout including a plurality of cell lines, as shown in FIG. 11A, cells are arranged so that a power supply wire and a substrate or well potential wire is shared between adjacent cells in the up-to-down direction for the purpose of reduction in area. In FIG. 11A, a reinforcing power supply cell is arranged in each of the cell lines. Thus, a stable potential can be independently supplied as a substrate or well potential from a power supply potential. However, when a reinforcing power supply cell is arranged in each of the cell lines, a region for arranging other cells is reduced and a wire resource which can be used in the second wiring layer is reduced because the second wiring layer is used in each of the reinforcing power supply cells, thus resulting in increase in chip area.

In contrast, in FIG. 11B, a reinforcing power supply cell 112 is removed from the cell line 115b, so that a reinforcing power cell is arranged in every second cell line. In this case, the potential PWVSS is supplied to a p-well 110 by a reinforcing power supply cell 113 and the potential NWVDD is supplied to an n-well 111 by a reinforcing power supply cell 114.

According to this embodiment, the original object of a reinforcing power supply cell can be achieved, i.e., independent supply of a stable potential as a substrate or well potential from a power supply potential can be provided, and also the number of reinforcing power supply cells to be arranged can be reduced. Accordingly, a region for arranging other cells is increased and a wiring region in the second wiring layer is increased, thus resulting in reduction in chip area.

In FIGS. 11A and 11B, the structure in which the known reinforcing power supply cell of FIGS. 13A through 13E is inserted in each cell line in which cells of FIGS. 12A through 12E are arranged is illustrated. However, a structure in which a reinforcing power supply cell according to each of the above-described embodiments is inserted may be used.

A layout structure of a semiconductor device according to the present invention can be utilized for a semiconductor integrated circuit or the like to be mounted on various electronic equipments.

What is claimed is:

1. A layout structure of a semiconductor device, the layout structure comprising:
    a cell line including a plurality of cells arranged in series; and
    a reinforcing power supply cell arranged in any one of positions between the cells in the cell line,
    wherein each said cell includes:
    a first impurity doped region arranged on a first well region for supplying a substrate or well potential which is different from a positive power supply potential to a p-type transistor arranging region; and
    a second impurity doped region arranged on a second well region for supplying a substrate or well potential which is different from a ground potential to an n-type transistor arranging region,
    the first and second impurity doped regions of the cells adjacent to each other are electrically and physically connected, respectively,
    said reinforcing power supply cell includes:
    first and second power supply impurity doped regions to which the first and second impurity doped regions in one of the cells located adjacent thereto are electrically connected, respectively;
    first and second power supply wires provided in a first wiring layer formed above the first and second power supply doped regions and electrically connected to the first and second power supply impurity doped regions, respectively; and
    first and second pins provided in a second wiring layer formed above the first and second power supply wires and electrically connected to the first and second power supply wires, respectively, and the first and second pins are arranged in the same straight line extending in parallel to a direction of alignment of the cells, and in the second wiring layer, a first cell wire electrically connected to an adjacent cell adjacent to the reinforcing power supply cell is provided between the first pin and a region above the first power supply impurity doped region.

2. The layout structure of claim 1, in the second wiring layer, a second cell wire electrically connected to a second adjacent cell adjacent to the reinforcing power supply cell is provided between the second pin and a region above the second power supply impurity doped region.

3. A layout structure of a semiconductor device, the layout structure comprising:

a cell line including a plurality of cells arranged in series; and a reinforcing power supply cell arranged in any one of positions between the cells in the cell line, wherein each said cell includes:

a first impurity doped region arranged on a first well region for supplying a substrate or well potential which is different from a positive power supply potential to a p-type transistor arranging region; and a second impurity doped region arranged on a second well region for supplying a substrate or well potential which is different from a ground potential to an n-type transistor arranging region, the first and second impurity doped regions of the cells adjacent to each other are electrically and physically connected, respectively, said reinforcing power supply cell includes:

first and second power supply impurity doped regions to which the first and second impurity doped regions in one of the cells located adjacent thereto are electrically connected, respectively;

first and second power supply wires provided in a first wiring layer formed above the first and second power supply doped regions and electrically connected to the first and second power supply impurity doped regions, respectively; and first and second pins provided in a second wiring layer formed above the first and second power supply wires and electrically connected to the first and second power supply wires, respectively, and the first and second pins are arranged in the same straight line extending perpendicularly to a direction of alignment of the cells, and in the second wiring layer, a first cell wire electrically connected to an adjacent cell adjacent to the reinforcing power supply cell is provided between the first pin and a region above the adjacent cell.

4. The layout structure of claim 3, in the second wiring layer, a second cell wire electrically connected to a second adjacent cell adjacent to the reinforcing power supply cell is provided between the second pin and a region above the second adjacent cell.

5. A layout structure of a semiconductor device, the layout structure comprising:

a cell line including a plurality of cells arranged in series; and a reinforcing power supply cell arranged in any one of positions between the cells in the cell line, wherein each said cell includes:

a first impurity doped region for supplying a substrate or well potential which is different from a positive power supply potential to a p-type transistor arranging region; and a second impurity doped region for supplying a substrate or well potential which is different from a ground potential to an n-type transistor arranging region, the first and second impurity doped regions of the cells adjacent to each other are electrically connected, respectively, said reinforcing power supply cell includes:

first and second power supply impurity doped regions to which the first and second impurity doped regions in one of the cells located adjacent thereto are electrically connected, respectively;

first and second power supply wires provided in a first wiring layer formed above the first and second power supply doped regions and electrically connected to the first and second power supply impurity doped regions, respectively; and first and second pins provided in a second wiring layer formed above the first and second power supply wires and electrically connected to the first and second power supply wires, respectively, and the first and second pins are arranged in the same straight line extending in parallel to a direction of alignment of the cells, and in the second wiring layer, a first cell wire electrically connected to an adjacent cell adjacent to the reinforcing power supply cell is provided between the first pin and a region above the first power supply impurity doped region, wherein a width of each of the first and second pins in a direction perpendicular to the direction of alignment of the cells is set to be a minimum allowable width according to a process rule.

6. A layout structure of a semiconductor device, the layout structure comprising:

a cell line including a plurality of cells arranged in series; and a reinforcing power supply cell arranged in any one of positions between the cells in the cell line, wherein each said cell includes:

a first impurity doped region for supplying a substrate or well potential which is different from a positive power supply potential to a p-type transistor arranging region; and a second impurity doped region for supplying a substrate or well potential which is different from a ground potential to an n-type transistor arranging region, the first and second impurity doped regions of the cells adjacent to each other are electrically connected, respectively, said reinforcing power supply cell includes:

first and second power supply impurity doped regions to which the first and second impurity doped regions in one of the cells located adjacent thereto are electrically connected, respectively;

first and second power supply wires provided in a first wiring layer formed above the first and second power supply doped regions and electrically connected to the first and second power supply impurity doped regions, respectively; and first and second pins provided in a second wiring layer formed above the first and second power supply wires and electrically connected to the first and second power supply wires, respectively, and the first and second pins are arranged in the same straight line extending in parallel to a direction of alignment of the cells, and in the second wiring layer, a first cell wire electrically connected to an adjacent cell adjacent to the reinforcing power supply cell is provided between the first pin and a region above the first power supply impurity doped region, wherein the electrical connection between the first power supply wire and the first pin and the electrical connection between the second power supply wire and the second pin are each made using two or more contact holes.

7. A layout structure of a semiconductor device, the layout structure comprising:

a cell line including a plurality of cells arranged in series; and a reinforcing power supply cell arranged in any one of positions between the cells in the cell line, wherein each said cell includes:

a first impurity doped region for supplying a substrate or well potential which is different from a positive power supply potential to a p-type transistor arranging region; and a second impurity doped region for supplying a substrate or well potential which is different from a ground potential to an n-type transistor arranging region, the first and second impurity doped regions of the cells adjacent to each other are electrically connected, respectively, said reinforcing power supply cell includes:

first and second power supply impurity doped regions to which the first and second impurity doped regions in one of the cells located adjacent thereto are electrically connected, respectively;

first and second power supply wires provided in a first wiring layer formed above the first and second power supply doped regions and electrically connected to the first and second power supply impurity doped regions, respectively; and first and second pins provided in a second wiring layer formed above the first and second power supply wires and electrically connected to the first and second power supply wires, respectively, and the first and second pins are arranged in the same straight line extending perpendicularly to a direction of alignment of the cells, and in the second wiring layer, a first cell wire electrically connected to an adjacent cell adjacent to the reinforcing power supply cell is provided between the first pin and a region above the adjacent cell, wherein a width of each of the first and second pins in a direction parallel to the direction of alignment of the cells is set to be a minimum allowable width according to a process rule.

8. A layout structure of a semiconductor device, the layout structure comprising:

a cell line including a plurality of cells arranged in series; and a reinforcing power supply cell arranged in any one of positions between the cells in the cell line, wherein each said cell includes:

a first impurity doped region for supplying a substrate or well potential which is different from a positive power supply potential to a p-type transistor arranging region; and a second impurity doped region for supplying a substrate or well potential which is different from a ground potential to an n-type transistor arranging region, the first and second impurity doped regions of the cells adjacent to each other are electrically connected, respectively, said reinforcing power supply cell includes:

first and second power supply impurity doped regions to which the first and second impurity doped regions in one of the cells located adjacent thereto are electrically connected, respectively;

first and second power supply wires provided in a first wiring layer formed above the first and second power supply doped regions and electrically connected to the first and second power supply impurity doped regions, respectively; and first and second pins provided in a second wiring layer formed above the first and second power supply wires and electrically connected to the first and second power supply wires, respectively, and the first and second pins are arranged in the same straight line extending perpendicularly to a direction of alignment of the cells, and in the second wiring layer, a first cell wire electrically connected to an adjacent cell adjacent to the reinforcing power supply cell is provided between the first pin and a region above the adjacent cell, wherein the electrical connection between the first power supply wire and the first pin and the electrical connection between the second power supply wire and the second pin are each made using two or more contact holes.

* * * * *